United States Patent [19]

Wang et al.

[11] 4,220,395
[45] Sep. 2, 1980

[54] POLARIZATION CONVERTER AND CIRCUIT ELEMENTS FOR USE IN OPTICAL WAVEGUIDES

[75] Inventors: Shyh Wang, El Cerrito, Calif.; Manhar L. Shah, Melbourne Beach, Fla.; John D. Crow, Mohegan Lake, N.Y.

[73] Assignee: Regents of University of California, Berkeley, Calif.

[21] Appl. No.: 952,105

[22] Filed: Oct. 17, 1978

Related U.S. Application Data

[60] Division of Ser. No. 469,220, May 13, 1974, Pat. No. 4,153,328, which is a continuation of Ser. No. 296,238, Oct. 10, 1972, abandoned.

[51] Int. Cl.³ .............................................. G02B 5/14
[52] U.S. Cl. ................................ 350/96.12; 350/96.13
[58] Field of Search ................ 350/96.12, 96.13, 96.14

[56] References Cited

U.S. PATENT DOCUMENTS

| | | | |
|---|---|---|---|
| 3,655,261 | 4/1972 | Chang | 350/96.13 |
| 3,764,195 | 10/1973 | Blank et al. | 350/96.13 |

*Primary Examiner*—Stewart J. Levy
*Attorney, Agent, or Firm*—Flehr, Hohbach, Test

[57] ABSTRACT

Wave propagation in thin film optical waveguides using gyrotropic or anisotropic material in either the substrate or adjacent top layer with respect to the thin film waveguide is analyzed and a mode converter capable of converting TE to TM or TM to TE polarization is disclosed. Several mode converters constructed in accordance with the present invention are set forth. Also disclosed are other optical circuit elements constructed from such mode converters including a gyrator, isolator, an optical switch, and a non-destructive optical readout for magnetic memories.

21 Claims, 22 Drawing Figures

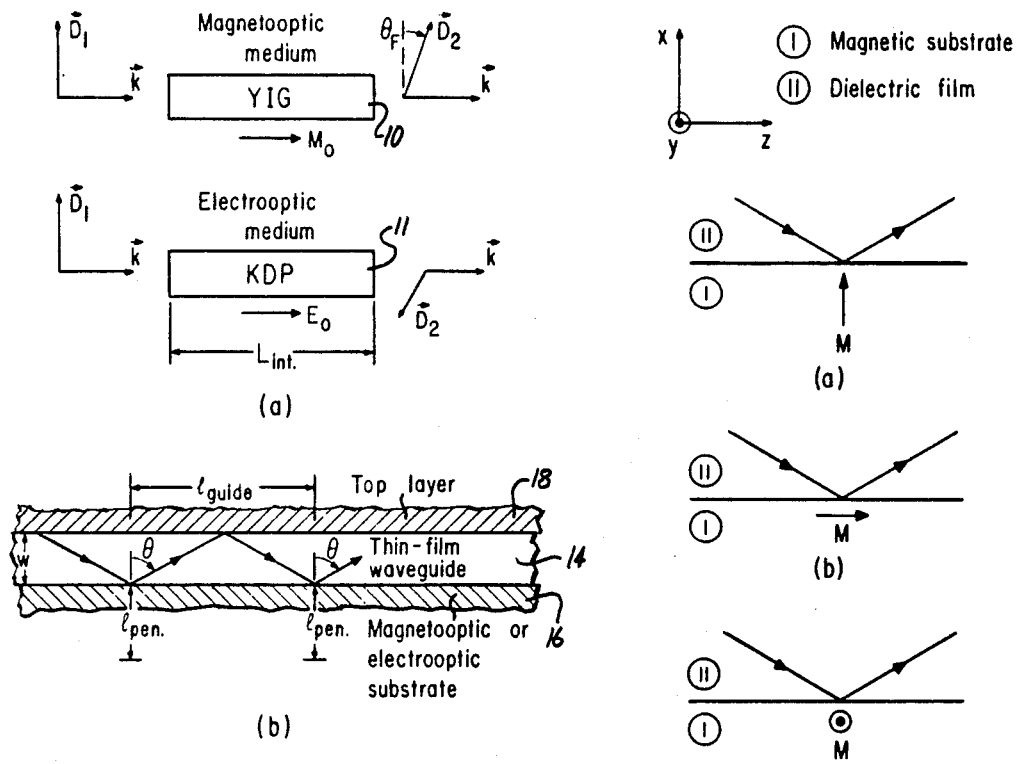
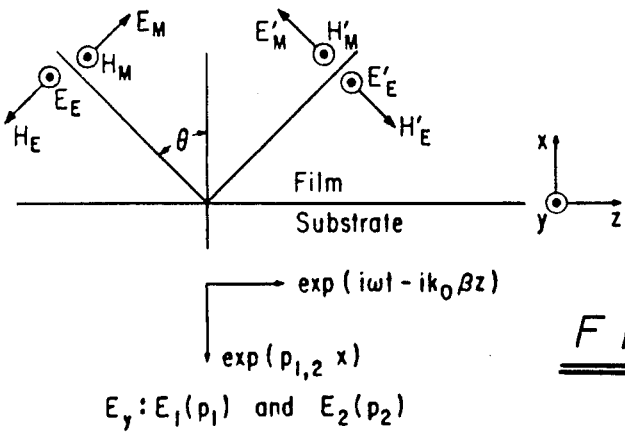

L = Interaction Length

Fig. 17 (b)
I : Magnetic mode converter
II : Phase shifter
III : Dielectric mode converter
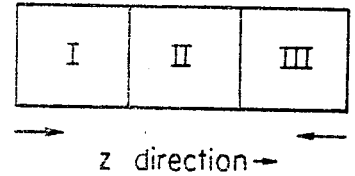
z direction
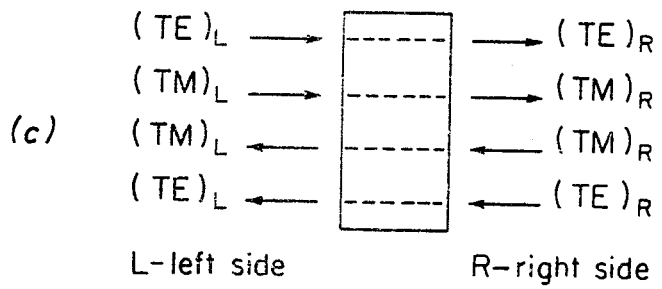
(c)
L-left side          R-right side
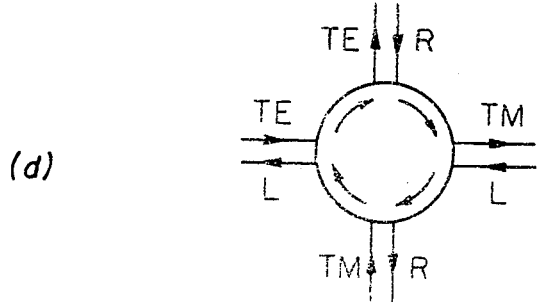
(d)
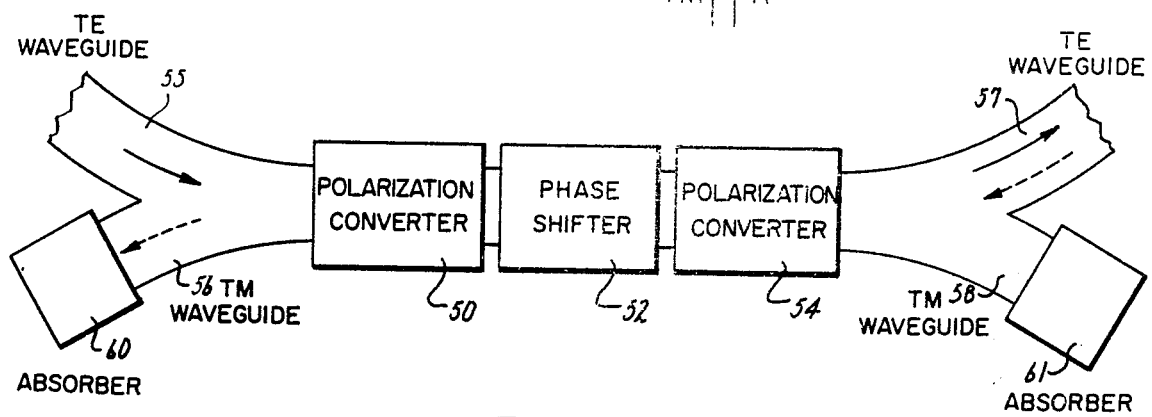
Fig. 18

I : Magnetic film    $n_m$
II : Optical waveguide    $n_f$
III : Rare dielectric film    $n_d$
IV : Prism    $n_p$ $n_p, n_f > n_m, n_d$

POLARIZATION CONVERTER AND CIRCUIT ELEMENTS FOR USE IN OPTICAL WAVEGUIDES

The invention herein described was made in the course of research sponsored by the Air Force Office of Scientific Research and the United States Army Research Office.

This is a division of application Ser. No. 469,220 now U.S. Pat. No. 4,153,328 filed May 13, 1974 which is a continuation of application Ser. No. 296,238 filed Oct. 10, 1972 now abandoned.

BACKGROUND OF THE INVENTION

This invention relates to optical waveguide systems and particularly to such devices modifying the properties of guided optical waves in integrated optical systems and therefore useful as circuit elements therein.

As used herein, the terms light and optical refer to the electromagnetic energy spectrum including visible light, infrared light, and ultraviolet light as to which the invention is immediately and obviously applicable; and to any immediately adjacent spectrum to which it can be extended.

In the practical utilization of the microwave spectrum, a large class of circuit elements have been developed including isolators, gyrators, cavaties, directional couplers and the like.

At the present time there is a growing body of knowledge and engineering concerning the propagation of light in thin films particularly with references to the propagation of coherent optical beams in such films and utilization of the same for practical purposes. These developments have been generally known as integrated optics, or optical waveguide systems. In general, there is a need for devices for use in the light spectrum which will correspond to the functions served by the previously enumerated microwave circuit elements.

SUMMARY OF INVENTION AND OBJECTS

In general, it is an object of the present invention to provide optical waveguide circuit elements for use in optical waveguides and also for the polarization conversion of guided light therein and to also provide circuit elements based on such polarization conversion for performing essential modulation and control functions in optical waveguide systems.

A further object is to provide circuit elements of the above character for use in optical waveguide corresponding to the gyrator, the isolator, a switch, and to provide an optical readout device capable of optically retrieving information stored in a magnetic media.

In order to understood the present invention, it is helpful to review and amplify certain basis concepts and to develop a theoretical basis for predicting the results of structures constructed in accordance with this invention.

In the following theoretical discussion, use is made of the editorial we, which should be understood to be taken in the first person singular. In the following general and theoretical description certain of the FIGURES and drawings herein will be used to illustrate both the structures proposed and the accompanying analysis. In that connection, the following is a brief description of those drawings utilized in connection with this theoretical description, the description of the remainder being given thereafter.

BRIEF DESCRIPTION OF THE DRAWINGS

FIGS. 1A is a schematic diagram illustrating schemes used in conventional laser systems for modulating a laser beam. YIG and KDP are used here as examples of magneto-optic and electro-optic substances in which the elements of the dielectric permittivity tensor may be modulated, respectively, by a bias magnetic or electric field.

FIG. 1B is a schematic diagram of a circuit element for use in integrated optics to control the propagation of a laser beam and constructed in accordance with the present invention.

FIG. 2 shows graphs depicting three basic configurations for magneto-optic effect: (a) polar, (b) longitudinal, and (c) equatorial.

FIG. 3 is a schematic diagram showing reflection and mode-conversion at the film-substrate boundary of a circuit element constructed in accordance with the present invention. In the film (waveguide medium), the two normal modes are the TE and TM modes. The various field components are denoted by: $E_E$, $H_E$ for the incident TE wave; $E_M$, $H_M$ for the incident TM wave; $E'_E$, $H'_E$ for the incident TM wave; $E'_E$, $H'_E$ for the reflected and converted TE wave; $E'_M$, $H'_M$ for the reflected and converted TM wave. The time and spatial dependence is indicated by the exponent term at the top. In the substrate the two normal modes are evanescent waves and have all three field components $E_x$, $E_y$ and $E_z$. Since $E_x$ and $E_z$ are related to $E_y$, we express them in terms of $E_y$. The quantities $E_1$ and $E_2$ represent the respective $E_y$ associated with the two modes with decay constants $P_1$ and $P_2$.

FIG. 10a is for YIG substrate with $TiO_2$ film (solid curves) or $As_2S_3$ glass film (dashed curves). FIG. 10b is for $LiNbO_3$ substrate used as an eletro-optic material (solid curves) or as an anisotropic material (dashed curves).

FIGS. 13-20 will be described hereinafter in connection with the structure realizations of the preferred embodiments.

I. THEORETICAL AND GENERAL DISCUSSION OF THE INVENTION

Figure 5:
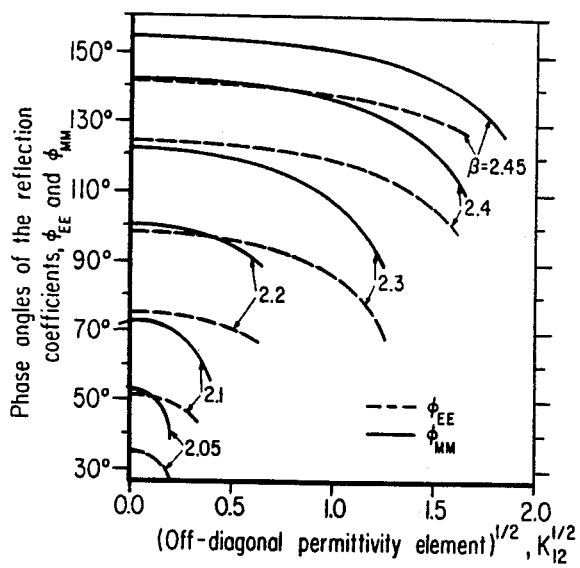
FIG. 5 shows graphs of phase angles of the reflection coefficients plotted as a function of $\sqrt{K_{12}}$ for several values of $\beta$. The parameters used in the calculation are the same as those in FIG. 4. The dashed curves are for TE to TE reflection whereas the solid curves are for TM to TM reflection.

Recent advances [1-5] in coupling a laser beam into a thin film optical waveguide and achieving laser action in thin films with an active dye ingredient have stimulated interest in integrated optical systems[6]. In that connection, cross reference is made to my related application entitled THIN FILM LASERS, Ser. No. 296,178 now abandoned filed concurrently herewith. The present invention is directed to the enabling of integrated optical systems to be put to practical use; particularly for performing modulation and control functions on a laser beam propagating in an optical waveguide system. Specifically, the effect of gryotropic and anisotropic substrate material on the propagation of laser beams in thin film optical waveguides will be analyzed.

FIG. 1a shows arrangements used in conventional optical systems to modulate the propagation property of a laser beam as the same is passed through a magneto-optic material 10 or an electro-optic medium 11. The propagation direction of the wave is $\vec{K}$. The initial polarization direction $\vec{D}_1$ is rotated as the wave passes through the medium to a new direction $\vec{D}_2$.

In the present invention, an optical waveguide structure is developed as shown in FIG. 1b in which the polarization conversion is accomplished at the boundary or interface between the waveguide layer 14 and either the adjacent substrate 16 which supports it or a top layer 18 disposed above it. In the drawing, the substrate is shown as having polarization-dependent propagation properties such that the off-diagonal elements in the dielectric-permittivity tensor of the substrate material provide the coupling, and hence the mechanism for conversion, between the two polarization waves (TE-transverse electric and TM-transverse magnetic) in the optical waveguide.

There are two basic requirements for the successful operation of such as optical waveguide device: (1) sufficient penetration of the evanescent wave into the substrate and (2) cumulative polarization conversion upon successive reflections at the boundary. If the penetration depth $l_{pen}$ is larger than the distance $l_{guide}$ traveled by the wave down the waveguide between two successive polarization-converting reflections, then the effective length of interaction between a laser beam and the substrate medium can be longer than the actual length of the waveguide. Thus, by operating a waveguide mode-converter with its incident angle near the critical angle one can reduce the linear dimensions of the mode-ocnverter to sizes compatible with the integrated-optics concept.

The second requirement concerns the relative phases of the incident and converted modes. Since mode conversion for a single reflection at the film-substrate boundary is quite small, cumulative polarization conversion is essential. Significant and efficient conversion from the TE to the TM mode, or vice versa, is possible only if certain phase conditions are met. In an analysis by Tien and Ulrich,[9] it has been shown that for constructive build-up of light intensity in an optical waveguide, the wave transmitted to the guide must be in phase with the wave already existing in the guide. A similar condition exists for mode conversion. Herein is derived the condition for total mode conversion and schemes to achieve it are analyzed.

Once we have shown the practicability of mode conversion, one can consider the feasibility of practical devices. Various schemes for the realization of such devices as the gyrator, the isolator, the optical switch, and the nondestructive read-out of information recorded on magnetic films are disclosed.

II. WAVE PROPAGATION IN GYROTROPIC AND ANISOTROPIC MEDIA

Wave propagation is gyrotropic and anisotropic media has been discussed and reviewed by many workers. [10-12] Here we summarize the pertinent results and make them directly applicable to the thin-film optical waveguide work. At optical frequencies, the relative permeability $\mu/\mu_0$ may be taken to be one [13,14] and the permittivity $\epsilon$ can be represented by a permittivity tensor:

$$\overset{*}{\epsilon} - c_0 \overset{*}{K} = c_0 \begin{bmatrix} K_{11} & K_{12} & K_{13}^* \\ K_{12}^* & K_{22} & K_{23} \\ K_{31} & K_{23}^* & K_{33} \end{bmatrix} \quad (1)$$

In the following discussion, all the media are assumed lossless. Therefore, the matrix is Hermitian and has real diagonal elements. Assuming an $\exp(i\omega t - i\vec{k}\cdot\vec{r})$ dependence for the fields, the electromagnetic wave equation is $$k^2\vec{E} = \vec{k}(\vec{k}\vec{E}) = k_0\vec{K}\cdot\vec{E} \quad (2)$$

where $\vec{K}$ is the relative permittivity tensor and $k_0 = \omega\sqrt{\mu_0\epsilon_0}$ is the free-space wave member.

For waveguiding is the film, an electromagnetic wave must be totally reflected at the film-substrate boundary. If we choose a coordinate system as shown in FIG. 2 or 3, then the wave in the substrate must be decaying in the negative x direction. Therefore, the electric field in the substrate can be expressed as $$\vec{E} = \vec{E}_0 \exp(i\omega t - ik_z z + pk_0 x) \tag{3}$$

where p is the decay constant normalized to $k_0$.

The phase constant $k_z$ can be obtained from Snell's law. Since the waves in the film and the substrate have the same phase in the propagation direction, they must have the same $k_z$. If we let $k_z = \beta k_0$, the wave number k in the substrate can be written in terms of $\beta$ and p as $$k_y^2 = k_z^2 + k_x^2 = k_0^2(\beta^2 - p^2) \tag{4}$$

The negative sign in front of $p^2$ indicates that the wave is an evanescent wave.

Now we return to the dielectric tensor of Eq. (1). Since the matrix is Hermitian, it can be diagonalized if the substrate is properly oriented with its principal axes coinciding with the x, y, and z axes of the chosen coordinate system. However, off-diagonal elements will appear under the following circumstances: (1) in a magnetooptic medium where there exists a nonvanishing magnetization, (2) is an anisotropic medium of which the principal axes are oriented along directions away from the coordinate axes, (3) in an electrooptic medium under an applied bias electric field, and (4) in an optically active medium. The off-diagonal elements are imaginary numbers is (1) and (4), and are real members in (2) and (3). We consider three simple cases, each with a single pair of off-diagonal elements: (a) the longitudinal configuration, $k_{12} \neq 0$, $K_{23} = K_{31} = 0$; (b) the polar configuration, $K_{23} \neq 0$, $K_{12} = K_{31} = 0$; (c) the equatorial configuration, $K_{31} \neq 0$, $K_{12} = K_{23} = 0$. We have borrowed the terminology from that used in describing the magnetooptic Kerr effect.

The three configurations for a waveguide structure using magnetooptic effects are illustrated in FIG. 2. In a magnetoopic medium, the off-diagonal elements can be written as $K_{ij} = i A_{ijl} M_l$ where $A_{ijl}$ is the magnetooptic constant and $M_l$ is the magnetization oriented is the l direction which is perpendicular to the ij plane. For example, if M is in the z direction (FIG. 2b), the only nonzero off-diagonal elements are $K_{12}$ and $K_{12}^*$ and thus we have the longitudinal configuration.

In an electrooptic medium, the change of dielectric constant for the linear electrooptic (Pockel's) effect can be written as $\Delta K_{ij}/K_{ii}K_{jj} = \Sigma r_{ijl} E_l$ where $r_{ijl}$ is the linear electrooptic coefficient. Take KDP as an example. With the principal axes coinciding with the coordinate axes and with the applied bias field $E_l$ pointing in the x direction, the only nonzero off-diagonal elements are $K_{12}$ and $K_{21} (= K_{12})$ and we have the longitudinal configuration.

Using Eq. (3) in Eq. (2) and eliminating $k^2$ through Eq. (4), we obtain a characteristic equation second-order in $p^2$ (Appendix 2). The two roots of this equation are:

$$(P_{1,2}^2)_L = \frac{1}{2K_{11}} [A + |K_{12}|^2 \pm \sqrt{B^2 + 2|K_{12}|^2 C + |K_{12}|^4}] \tag{5a}$$

for the longitudinal configuration and $$(P_{1,2}^2)_P = \frac{1}{2K_{11}} [A \pm \sqrt{B^2 - 4K_{11}|K_{23}|^2(B^2 - K_{11})}] \tag{5b}$$

for the polar configuration. The three parameters are $$A = \beta^2(K_{11} + K_{11}(K_{22} + K_{33}) \tag{5c}$$

$$B = \beta^2(K_{11} - K_{33}) + K_{11}(K_{33} - K_{22}) \tag{5d}$$

$$C = \beta^2(K_{11} + K_{33}) + K_{11}(K_{33} - K_{22}) \tag{5e}$$

The equatorial configuration will not be further discussed because there is no coupling between the two eigen modes in this configuration.

III. Reflection and Mode Conversion at the Film-Substrate Boundary

Now we consider the problem of reflection and mode conversion at the film-substrate boundary (FIG. 3). In the film, which is assumed isotropic, the two normal polarization modes are the TE (transverse electric) and TM (transverse magnetic) waves. Take the TE mode as an example. Since the three components $E_x$, $E_y$, and $E_z$ in the substrate medium are related to one another, the TE mode in the film will excite not only $E_y$ but $E_x$ and $E_z$ as well. The existence of $E_x$ and $E_z$ in the substrate medium, in turn, generates TM wave in the film. Therefore, at a film-substrate boundary, part of the TE wave is reflected and part is converted into a TM wave. A similar situation applies to the TM wave. The situation can best be described by a scattering matrix, $$\begin{pmatrix} E_E' \\ E_M' \end{pmatrix} = \begin{pmatrix} r_{EE} & r_{EM} \\ r_{ME} & r_{MM} \end{pmatrix} \begin{pmatrix} E_E \\ E_M \end{pmatrix} \tag{6}$$

where $E_E$, $E'_E$, $E_M$, and $E'_M$ are the complex amplitudes of the various fields defined in FIG. 3. In Eq. (6), $r_{EE}$ and $r_{MM}$ are the TE to TE and TM to TM reflection coefficients and $r_{EM}$ and $r_{ME}$ are the TM to TE and TE to TM mode conversion factors.

The reflection coefficients and the mode-conversion factors can be found by equating the tagential components of $\vec{E}$ and $\vec{N}$ at the film-substrate boundary (Appendix 1) and by establishing the relations between the field components in the substrate (Appendix 2). The expressions for the matrix elements are given below:

$$r_{EE} = \frac{1}{F} \left( \frac{G_1 J_2^*}{L_1} - \frac{G_2 J_1^*}{L_2} \right), \tag{7a,b}$$

$$r_{MM} = \frac{1}{F} \left( \frac{G_1^* J_2}{L_1} - \frac{G_2^* J_1}{L_2} \right) \tag{7c,d}$$

$$(r_{EM})_L = \frac{2i(P_1 - P_2)n_f \cos\theta}{F\beta K_{12}},$$

$$(r_{ME})_L = \frac{2i(P_1 - P_2)n_f \cos\theta}{F\beta K_{12}^*}$$

$$(r_{EM})_P = \frac{-2(P_1 - P_2)n_f \cos\theta}{FK_{23}^*}, \tag{7e,f}$$

$$(r_{ME})_P = \frac{2(P_1 - P_2)n_f \cos\theta}{FK_{23}}$$

The various parameters are defined as $$F = \frac{G_1 J_2}{L_1} - \frac{G_2 J_1}{L_2} \tag{8a}$$

$$(G_{1,2})_L = K_{33} \cos\theta - i P_{1,2} n_f \tag{8b}$$

$$(G_{1,2})_P = P_{1,2} K_{11} \cos\theta - i(\beta^2 - K_{11})n_f \tag{8c}$$

$$J_{1,2} = n_f \cos\theta - i P_{1,2} \qquad (8d)$$

$$L_{1,2} = \beta^2 K_{33} - K_{11}K_{33} - K_{11}P_{1,2}^2 \qquad (8e)$$

The subscripts therefore L and P refer to quantities associated with the longitudinal and polar configuration, respectively. The quantities without either subscript apply to both configurations.

The quantities important to mode conversion are the magnitude $|r_{EM}| = |r_{ME}|$ of the mode-conversion factor and the phase angles ($\phi_{EE}$ and $\phi_{MM}$) of the reflection coefficients $r_{EE}$ and $r_{MM}$. To gain insight into the problem of mode conversion, we consider a hypothetical case where the substrate is isotropic with $K_{11} = K_{22} = K_{33}$ and oriented in the longitudinal configuration; but the values of the off-diagonal elements $K_{12}$ and $K_{12}^*$ are unspecified. For isotropic media, the parameters $L_1$ and $L_2$ become $$L_{1,2} = \mp (P_{1,2}^2 + K_{11})^{\frac{1}{2}} |K_{12}|/\sqrt{K_{11}} \qquad (9)$$

As an example, we use a value of $n_f = 2.50$ for the refractive index in the film and a value of $n_s = \sqrt{K_{11}} = 2.00$ for the refractive index in the substrate. The other two parameters which are needed to completely specify the problem are the values of the off-diagonal element $K_{12}$ and the incident angle $\theta$ (or the parameter $\beta = n_f \sin\theta$). We take $K_{12}$ and $\theta$ as adjustable parameters, and plot the values of $|r_{EM}| = |r_{ME}|$, $\phi_{EE}$, and $\phi_{MM}$ in FIGS. 4 and 5 as functions of $\sqrt{K_{12}}$ and $\beta$.

Two important features of the computational results are the dependence of $|r_{EM}| = |r_{ME}|$ upon the incident angle (or the value of $\beta$) and the difference in the phase angles $\phi_{EE}$ and $\phi_{MM}$. The magnitude of the mode-conversion factor $|r_{EM}|$ increases with $K_{12}$ as expected. However, for a given material (that is, a given $K_{12}$), the value of $|r_{EM}|$ increases as $\theta$ decreases toward the critical angle $\theta_{crit} = \sin^{-1}(n_s/n_f)$ or $\beta_{crit} = n_s$. As $\theta$ approaches the critical angle, $P_{1,2}$ decreases. A further penetration of the evanescent wave into the substrate increases the interaction between the TE and TM waves, and thus enhances the mode conversion.

Let us compare a thin-film waveguide mode-converter with a conventional mode-converter. For ordinary Faraday rotation (FIG. 1a), the conversion per unit distance is $$G_F = \frac{\theta_F}{d} = \frac{\pi}{\lambda} \frac{K_{12}}{\sqrt{K_{11}}} \qquad (10a)$$

For the waveguide mode-converter (FIG. 1b), $$G_W = \frac{|r_{EM}|}{l_{guide}} = \frac{|r_{EM}|}{2W \tan\theta} \qquad (10b)$$

Since W is of the order of wavelength $\lambda$, the conversion ratio is $$\frac{G_W}{G_F} = \frac{|r_{EM}|}{2s K_{12} \tan\theta} \sqrt{K_{11}} \qquad (10c)$$

Figure 4:
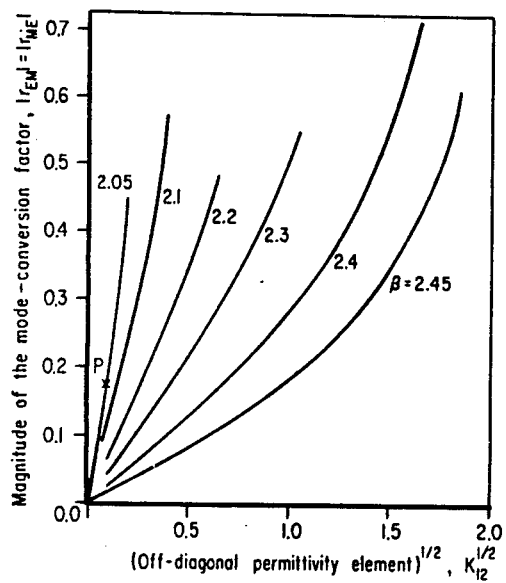
FIG. 4 shows graphs depicting magnitude of the mode-conversion factor plotted as a function of $\sqrt{K_{12}}$ for several values of $\beta$. The other parameters are chosen as $n_f = 2.50$ and $n_s = 2.00$ for the respective index in the film and in the substrate. The various values of $\beta$ correspond to incident-angle variation from $\theta = 79°(\beta = 2.45)$ to $\theta = 55.5°(\beta - 2.05)$. The critical angle is 53°.

To estimate the ratio $G_W/G_F$, we use the point P in FIG. 4 as an example. For $n_f = 2.5$, $\sqrt{K_{11}} = 2.00$ and $\beta = 2.05$, $\theta = 55°$ and $\theta_{crit} = 53°$. At P, $K_{12} = 0.01$ and $|r_{EM}| = 0.18$. Using these values in Eq. (10c), we find $G_W = 4G_F$. This calculation shows that it is conceivable to achieve a ratio larger than 1 for $G_W/G_F$. A similar reduction in size is also possible for electrooptic modulators of the waveguide type as compared to the conventional type. As long as $\theta$ is within about ten degrees of the critical angle, a waveguide polarization converter can be as efficient as a conventional one.

Figure 6:
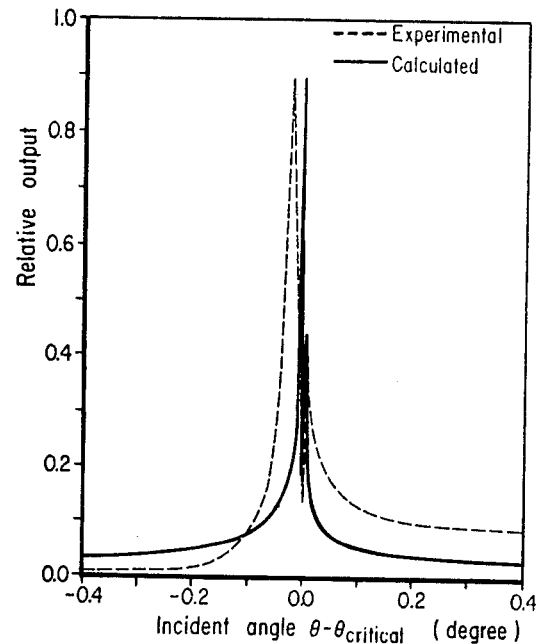
FIG. 6 shows the measured (dashed curve) and calculated (solid curve) output of a reflection experiment performed on a KDP-CS$_2$ boundary. The difference between the incident angle and the critical angle is used as the abscissa. Therefore, the positive side represents the totally reflecting case whereas the negative side represents the refracting case. The refractive-index data used are; $\sqrt{K_{11}} = \sqrt{K_{22}} = 1.5064$ and $\sqrt{K_{33}} = 1.4664$ for KDP and $n_f = 1.6$ for CS$_2$.

To verify the variation of $|r_{EM}|$ with $\theta$ near the critical angle, we have performed an experiment using KDP as the substrate immersed in $CS_2$. A He-Ne laser beam with a TM polarization was incident onto the KDP crystal, and the component of the reflected wave with the TE polarization was measured by a photomultiplier through a crossed polarizer. The KDP crystal was biased by a low-frequency electric field with a 3.6 KV/cm peak value and oriented in the longitudinal configuration. The recorder trace of the measured r.m.s. output (the dashed curve) of the photomultiplier is plotted in FIG. 6 as a function of $\theta$.

Since the input polarizer has a finite extinction ratio of about $10^{-3}$, the incident beam had a small TE component $E_1$ besides a large TM component $E_2$. The output beam, therefore, consists of two TE components, one component $r_{EE} E_1$ due to pure reflection and the other $r_{EM} E_2$ due to polarization conversion. Since $r_{EE}$ and $r_{EM}$ are known functions of $\theta$, the output can be calculated on a relative scale if the ratio $E_1/E_2 = A \exp(i\gamma)$ is known. The solid curve in FIG. 6 was calculated by using $A = 0.05$ and $\gamma = 155°$. The measured and calculated curves are in general agreement.

The dip in the output is caused by a rapid change in the phase difference between $r_{EE}$ and $r_{EM}$ near the critical angle. Outside $|\theta - \theta_{crit}| = 0.05°$, the phase variation becomes less rapid, and the change in the curves reflects the variation of $|r_{EM}|$ with $\theta$. For waveguide applications, we want a device to be operated at a few degrees away from $\theta_{crit}$ (Sec. VI) but still close to $\theta_{crit}$. The critical angle for the KDP-$CS_2$ system is 68.42°. Calculated results show that the value of $|r_{EM}|$ decreases by a factor of 2.8 if $\theta$ changes from 69.3° to 73.3° and by another factor of 3.3 from 74° to 82°.

IV. Conditions and Arrangements for Cumulative Mode Conversion

For most device applications, we would want to use magnetooptic and electrooptic materials as substrates so that wave propagation in a mode converter can be controlled by a bias magnetic or electric field. However, such devices are expected to have a small mode-conversion factor (that is, a small ratio of $r_{ME}/r_{EE}$ or $r_{EM}/r_{MM}$) because of a small off-diagonal element. For example, the magnitude of $K_{12}$ in YIG is calculated to be $3 \times 10^{-4}$ from the Faraday rotation[15] of 240°/cm and the off-diagonal element $K_{ij}$ in LiNbO$_3$[16] is about $7 \times 10^{-4}$ at a bias field of 10 KV/cm. Although magnetooptic materials[17,18] such as EuSe and EuO have been found to have a Faraday rotation of about $10^5$ degrees/cm and electrooptic materials[19,20] such as SEN and KTN have been found to have large electrooptic effects, the value of $K_{12}$ is still less than 0.1. To enhance magnetooptic and electrooptic effects, we propose to use a thin-film waveguide structure so that the mode-conversion effects can become cumulative. For constructive interference, certain phase conditions must be met.

Figure 7:
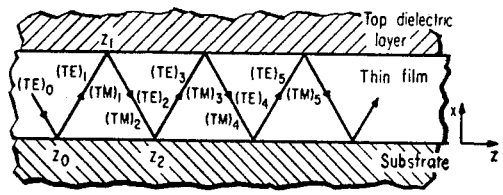
FIG. 7 is a diagram showing multiple reflection in an optical waveguide. The basic scattering matrix relates the incident electric fields (TE)$_0$ and (TM)$_0$ at $z_0$.

For the derivation of these phase conditions, we refer to FIG. 7. At the film-substrate boundary, the field components are related by Eq. (6). In the film, the fields suffer a phase delay ($\phi_{dE}$ for the TE wave and $\phi_{dM}$ for the TM wave) in going from the point $z_0$ to $z_2$. At the film-top layer boundary (at $z_1$), the fields suffer another phase change ($\phi_E$ for the TE wave and $\phi_M$ for the TM wave) but no amplitude change. Therefore, the various field components at $z=z_0$ at $z_2$ are related by $$\begin{bmatrix} (TE)_2 \\ (TM)_2 \end{bmatrix} = \begin{bmatrix} \exp(i\phi_E') & 0 \\ 0 & \exp(i\phi_M') \end{bmatrix} \begin{bmatrix} r_{EE} & r_{EM} \\ r_{ME} & r_{MM} \end{bmatrix} \begin{bmatrix} (TE)_0 \\ (TM)_0 \end{bmatrix} \quad (11)*$$

*The notations (TE) and (TM) are used from hereon to represent the complex amplitudes of the TE and TM electric fields.

In Eq. (11), the phase changes in the film and at the upper boundary are jointly represented by the first scattering matrix with $\phi'_E = \phi_E - \phi_{dE}$ and $\phi'_M = \phi_M - \phi_{dM}$.

For simplicity, we assume that we start with a $(TE)_0$ wave. Upon reflection at $z_2$, the TM wave is given by $(TM)_3 = r_{ME}(TE)_2 + r_{MM}(TM)_2$, or $$(TM)_3 = r_{ME}[r_{EE}\exp(i\phi'_E) + r_{MM}\exp(i\phi'_M)](TE)_0 \quad (12)$$

with $r_{EE} = |r_{EE}| \exp(i\phi_{EE})$ and $r_{MM} = |r_{MM}| \exp(i\phi_{MM})$. The two components in Eq. (12) are in phase if their phase angles differ by an integral multiple of $2\pi$. Since we start out with a TE wave, it is implied that the TE mode is the propagating mode of the waveguide. Therefore, the necessary conditions for phase synchronism are $$\phi_{EE} + \phi_E - \phi_{dE} = q2\pi \text{ and } \phi_{MM} + \phi_M - \phi_{dM} = q'2\pi \quad (13)$$

where q and q' are integers.

Figure 8:
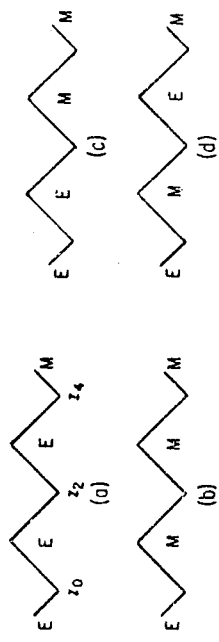
FIG. 8 shows diagrams a–d showing all four possible combinations by which an incident TE wave can be converted into a TM wave after making three reflections at the lower boundary and two reflections at the upper boundary.

To further examine whether the conditions stated in Eq. (13) are sufficient for subsequent reflections, we show in FIG. 8 all four possible combinations after the third reflection. The letters E and M represent the character of the wave. Adding the four components, we have $$(TM)_5 = (TE)_0[r_{EE}^2 r_{ME} \exp(i2\phi'_E) + r_{ME}r_{MM}^2\exp(i2\phi'_M) + r_{EE}r_{ME}r_{MM}\exp(i\phi'_E + i\phi'_M) + r_{ME}r_{EM}r_{ME}\exp(i\phi'_E + i\phi'_M)] \quad (14)$$

Using the conditions stated in Eq. (13), we can easily show that the first three terms in Eq. (14) are indeed in phase. The fourth term is in phase opposition and it accounts for the fact that the amplitude of the TE wave progressively decreases as a result of conversion into the TM wave.

To see whether or not the conditions stated in Eq. (13) can be simultaneously satisfied, we examine the magnitudes of the phase angles. Referring to FIG. 5, we see that the values of $\phi_{EE}$ and $\phi_{MM}$ are not affected by $K_{12}$ at small values of $K_{12}$. Therefore, in obtaining phase information, we may set the off-diagonal elements equal to zero. As a result, the phase condition becomes identical for longitudinal and polar configurations. Also, this simplifying step enables us to treat the problems of mode conversion and phase synchronism independently. The step is taken to gain information that will guide us in working out schemes to achieve the phase-synchronous condition. In the calculations to be presented in Sec. VI for actual mode-converting structures, the exact formulas are used.

With $K_{ij}=0$ for $i \neq j$ in Eq. (5), we find $$P_1 = P_E = (B^2 - K_{22})^{\frac{1}{2}}, P_2 = P_M - [\frac{K_{33}}{K_{11}}(B^2 - K_{11})]^{\frac{1}{2}} \quad (15)$$

Since $K_{12}$ and $K_{23}$ are assumed zero, the two evanescent modes become pure TE and TM waves. The subscripts E and M are used to indicate the character of the wave. Using Eq. (15) in Eq. (8e), we find $L_M = 0$. Thus, only the terms with $L_M^{-1}$ in Eq. (7) are important, and we have $r_{EE} = J_E^*/J_E$ and $r_{MM} = G_M^*/G_M$. From Eq. (8d,b), we obtain $$\phi_{EE} = 2\tan^{-1}(\frac{P_E}{n_f\cos\theta}), \phi_{MM} = 2\tan^{-1}(\frac{P_M}{n_f\cos\theta} \frac{n_f^2}{K_{33}}) \quad (16a,b)$$

The expressions for $\phi_E$ and $\phi_M$ are similar to Eq. (16) except that the values of $K_{11}$, $K_{22}$, and $K_{33}$ are different. In other words, there are two dielectric tensors, one for the substrate and the other for the top layer (FIG. 1). Further, $K_{ij}=0$ if $i \neq j$ for the top layer.

The simplest way to satisfy Eq. (13) is to make the total phase changes equal. Since the film is assumed isotropic, $\phi_{dE} = \phi_{dM}$ and the phase condition reduces to $$\phi^E = \phi_{EE} + \phi_E = \phi^M = \phi_{MM} + \phi_M \quad (17)$$

If both the substrate and the top layer are isotropic, $n_f^2 > K_{11} = K_{33}$. Thus, from Eq. (16), we see that $\phi_{MM} > \phi_{EE}$.[21] This conclusion is confirmed by the computational results shown in FIG. 5. Similarly, $\phi_M > \phi_E$. Therefore, the synchronous phase condition can be satisfied only if we use anisotropic material for either the substrate or the top layer in FIG. 1.

For an anisotropic substrate (or top layer), the phase angle $\phi_{MM}$ (or $\phi_M$) can be made smaller than $\phi_{EE}$ (or $\phi_E$) by choosing $K_{33} > n_f^2$ and yet keeping $K_{11}$ and $K_{22} < \beta^2$. This flexibility makes it possible to operate the mode converter degenerately with $\phi^E = \phi^M$. As an example, we consider the case for which both the substrate and the top layer are made of uniaxial crystals. The crystals are oriented with the optic axes in the z direction, so $K_{11} = K_{22} = n_0^2$ and $K_{33} = n_e^2$. From Eqs. (15) and (16), we find $p_M = (n_e/n_0)p_E$ and $$\phi_{MM} = 2\tan^{-1}(\frac{P_E}{n_f\cos\theta} \frac{n_f^2}{n_0 n_e}) \quad (18)$$

The two phase angles $\phi_{EE}$ and $\phi_{MM}$ are equal if $$n_f^2 = n_0 n_e \quad (19)$$

Since $n_0 < n_f$ as required for waveguiding, it is necessary to have $n_e > n_f > n_0$ (a positive uniaxial crystal). An equation similar to Eq. (19) but with a different set of values for $n_0$ and $n_e$ applies to the top layer. Note that if Eq. (19) holds for both the substrate and the top layer, then the phase condition stated in Eq. (17) is met at all incident angles.

Another possible arrangement is one in which only the top layer is anisotropic. As an example, we choose the following values for the various parameters: $n_f = 2.35$, $\beta = 2.30$, and $n_s = \sqrt{K_{11}} = 2.25$ (substrate index). From Eqs. (15) and (16), we find $p_E = p_M = 0.477$, $\phi_{EE} = 88.8°$, and $\phi_{MM} = 94.2°$. For $n_0 = 2.25$ in the top layer, $\phi_E = \phi_{EE} = 88.8°$, and we need a value of 2.70 for $n_e$ in order to satisfy Eq. (17). If both the substrate and the top layer were anisotropic with $n_0 = 2.25$, a value of 2.45 for $n_e$ would be needed.

An alternate scheme to have $\phi_M < \phi_E$ is to make $p_M < p_E$ by letting $K_{11} > K_{22}$ and yet keeping $K_{11}$ and $K_{22} < \beta^2$. As an example, we assume the top layer to be anisotropic with its optic axis oriented in the y direction ($K_{22} = n_e^2$ and $K_{11} = K_{33} = n_0^2$). For the same set of values for $n_f$, $\beta$, and $n_s$, we can choose $n_e = 2.25$ and $n_0 = 2.27$ for the top layer to satisfy Eq. (17). The requirement on birefringence for this case can easily be met. Practical examples of mode converters using this scheme will be given in Section VI.

V. Properties of the Scattering Matrix

The elements of the scattering matrix have some interesting and useful properties. From Eq. (7), we see that the quantities $F r_{EE}$ and $F r_{MM}$ are complex conjugate to each other. Thus, we let $|r_{EE}| = |r_{MM}| = r_{11}$. If $F = |F| \exp(-i\phi)$, then $\phi_{EE} + \phi_{MM} = 2\phi$.

Next we examine the mode-conversion factors. For the longitudinal gyrotropic and the polar anisotropic cases, $K_{12}$ is purely imaginary in Eq. (7c,d) and $K_{23}$ is real in Eq. (7e,f). Thus, the quantities $F r_{EM}$ and $F r_{ME}$ are real numbers, and $F r_{EM} = -F r_{ME}$. We can write $r_{EM} = -r_{ME} = r_{12} \exp(i\phi)$ where $r_{12}$ is a real number. Further, we rewrite Eq. (11) as $$\begin{bmatrix} (TE)_2 \\ (TM)_2 \end{bmatrix} = \begin{bmatrix} r'_{EE} & r'_{EM} \\ r'_{ME} & r'_{MM} \end{bmatrix} \begin{bmatrix} (TE)_0 \\ (TM)_0 \end{bmatrix} \quad (20)$$

The various matrix elements are $$r'_{EE} = r_{11} \exp(i\phi'_E + i\phi_{EE}),$$
$$r'_{MM} = r_{11} \exp(i\phi'_M + i\phi_{MM}) \quad (21a,b)$$

$$r'_{EM} = r_{12} \exp(i\phi'_E + i\phi) = r_{12} \exp(i\alpha) \quad (21c)$$

$$r'_{ME} = -r_{12} \exp(i\phi'_M + i\phi) = -r_{12} \exp(i\alpha') \quad (21d)$$

If the mode-propagating conditions stated in Eq. (13) are satisfied, then $r'_{EE}$ and $r'_{MM}$ are real and $$\alpha + \alpha' = \phi'_E + \phi'_M + 2\phi = (q' + q)2\pi -$$
$$(\phi_{EE} + \phi_{MM}) + 2\phi = (q + q')2\pi$$

In other words, $\exp(i\alpha') = \exp(-i\alpha)$. Thus, we can rewrite $[r_{ij}]$ of Eq. (20) as $$[r'_{ij}] = \begin{bmatrix} r'_{EE} & r'_{EM} \\ r'_{ME} & r'_{MM} \end{bmatrix} = \begin{bmatrix} r_{11} & r_{12} \exp(i\alpha) \\ -r_{12} \exp(-i\alpha) & r_{11} \end{bmatrix} \quad (22a)$$

After 2n successive reflection at the two boundaries, the amplitudes of the two modes are given by $$\begin{bmatrix} (TE)_{2m} \\ (TM)_{2m} \end{bmatrix} = \begin{bmatrix} r'_{EE} & r'_{EM} \\ r'_{ME} & r'_{MM} \end{bmatrix} \begin{bmatrix} (TE)_0 \\ (TM)_0 \end{bmatrix} = \quad (23a)$$
$$\begin{bmatrix} A_m & B_m \exp(i\alpha) \\ -B_m \exp(-i\alpha) & A_m \end{bmatrix} \begin{bmatrix} (TE)_0 \\ (TM)_0 \end{bmatrix}$$

For the longitudinal anisotropic and the polar gyrotropic cases, $K_{12}$ is real in Eq. (7c,d) and $K_{23}$ is purely imaginary in Eq. (7e,f). Thus, the quantities $F r_{EM}$ and $F r_{ME}$ are equal and imaginary. For these two cases, the relevant scattering matrices have the following forms:

$$[r'_{ij}] = \begin{bmatrix} r_{11} & ir_{12} \exp(i\alpha) \\ ir_{12} \exp(-i\alpha) & r_{11} \end{bmatrix} \quad (22b)$$

which is the counterpart to Eq. (22a) and $$[r'_{ij}]^m = \begin{bmatrix} A_m & iB_m \exp(i\alpha) \\ iB_m \exp(-i\alpha) & A_m \end{bmatrix} \quad (23b)$$

which is the counterpart to Eq. (23a).

An important property of the scattering matrix is that under the phase-matched condition the product $r'_{EM} r'_{ME} = -r_{12}^2$ is a negative number whereas $r'_{EE}{}^2$ and $r'_{MM}{}^2$ are positive numbers. The opposite sign means physically that if we start with a TE wave, the TE created by the converted TM wave through the process TE→TM→TE is always in phase opposition to the original TE wave.* This fact ensures a continuous conversion of TE into TM mode and vice versa. Another property of $[r'_{ij}]^m$ is that after many reflections, the diagonal elements remain real and the phase angles of the off-diagonal elements remain unchanged. Since there is a continuous conversion between TE and TM modes, we might expect an ultimate situation in which the energy would be equally divided between the two modes. The mode conversion does not stop, however, at the equal energy point. If $A_m = B_m = 1/\sqrt{2}$ in Eq. (23a), then $$[r'_{ij}]^{2m} = \begin{bmatrix} 0 & \exp(i\alpha) \\ -\exp(i\alpha) & 0 \end{bmatrix} \quad (24)$$

Equation (24) predicts a 100 percent conversion. After complete conversion, the converted mode begins to convert back to the original mode and we expect mode conversion to continue indefinitely. This conclusion is indeed confirmed by computational results and by the theory on matrix multiplication which we consider below.

*For the polar configuration, $P_{1,2}$ becomes complex if the substrate is isotropic. In this case, $r'_{EM} r'_{ME}$ is positive, but $r'_{EE}{}^2$ and $r'_{MM}{}^2$ become negative. With the aid of FIG. 8, the reader can show that the statement is still true.

The multiple scattering matrices of Eq. (23) can be obtained by using Sylvester's theorem[22] (Appendix 3). Since all the media are assumed lossless, electromagnetic energy must be conserved so that $r_{11}^2 + r_{12}^2 = 1$. With this relation, the matrix elements are found to be $$A_m = \cos(m |r_{EM}|), \quad B_m = \sin(m |r_{EM}|) \quad (25)$$

For most magnetooptic and electrooptic media, $|r_{EM}| << 1$ and $|r_{EE}| = 1$. Thus, we approximate $\tan^{-1}(|r_{EM}|/|r_{EE}|)$ by $r_{EM}$. This approximation is used in obtaining Eq. (25).

Figure 9:
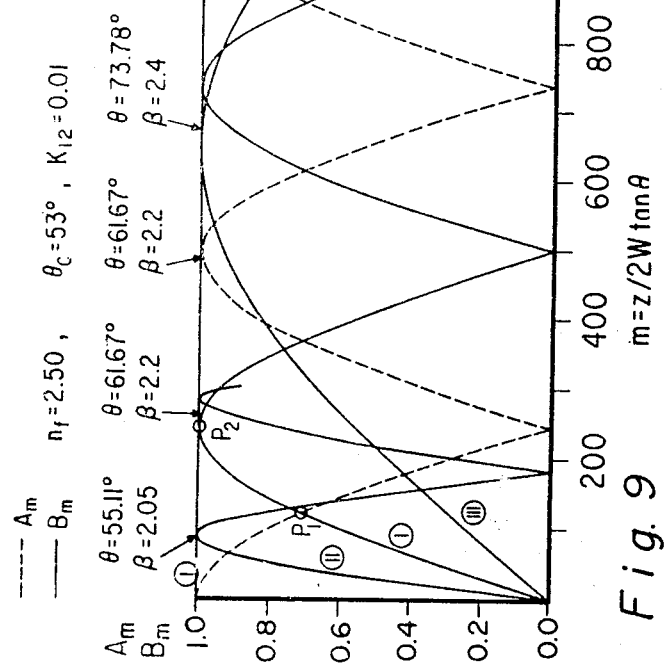
FIG. 9 shows elements A$_m$ and B$_m$ of the multiple scattering matrix plotted as a function of the number m of complete reflections for a hypothetical case with $K_{12} = 0.01$. The other material parameters used in the computation are: $n_f=2.50$, $n_s=2.00$, and $\theta_{crit}=53°$. The three cases are for three different incident angles.
Figure 12:
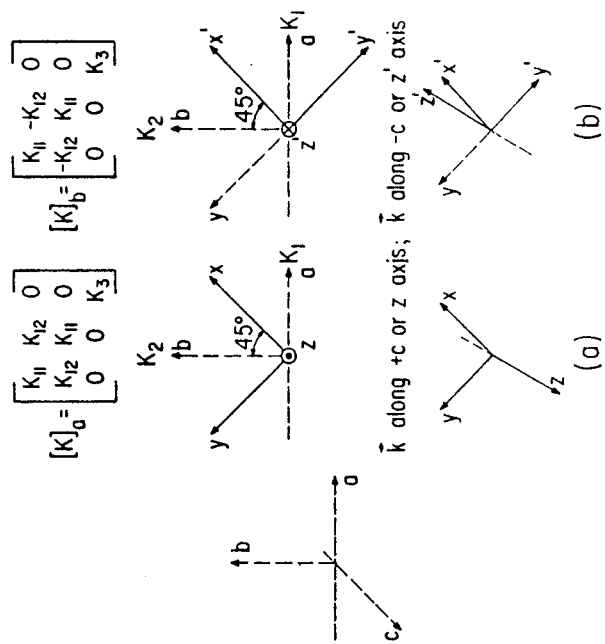
FIG. 12 are diagrams showing the nonreciprocal nature of a birefringent crystal. The word "nonreciprocal" is used in the sense that the sign of the off-diagonal elements in the permittivity tensor must be changed for waves propagating in opposite directions if the right-hand coordinate system is to be preserved.

Since Eq. (25) is based on $\phi^E = \phi^M$, the conditions as stated in Eqs. (13) and (17) are not merely for cumulative mode conversion but also for complete mode conversion. To verify the sinusoidal variation of mode conversion, we evaluate the elements in Eq. (23) with the aid of a computer. FIG. 9 shows the computational results of the matrix elements $A_m$ (dashed curve) and $B_m$ (solid curve) as a function of the number m of reflections at the film-substrate boundary. Since the distance between $z_2$ and $z_0$ is $2W \tan \theta$ in FIG. 7, the number is simply equal to $m = z/(2W \tan \theta)$. The point $P_1$ (circled)

indicates the point of half conversion (energy-wise) whereas the point P₂ (also circled) marks the point of full conversion from one mode to the other.

There are three curves for $B_m$ in FIG. 9. We used the following values: $n_f=2.50$, $\theta_{crit}=53°$ for the critical angle (for $n_s=2.00$), and $K_{12}=0.01$ for all three curves. The three curves are computed under phase-matched condition and for different values of the incident angle $\theta$ with (I) $\theta=61.67°$ and $\beta=2.2$, (II) $\theta=55.11°$ and $\beta=2.05$, and (III) $\theta=73.78°$ and $\beta=2.40$. As we can see, the number m of reflections required to reach full conversion decreases from a value of 650 to 90 as we change $\theta$ from 73.78° to 55.11″. This is a result of increasing penetration of the evanescent wave into the substrate.

VI. Mode Converting Structures and Their Performance Characteristics

The computational result shown in FIG. 9 presupposes $\phi^E=\phi^M$. To show that the synchronous phase condition can be satisfied in real cases and that the construction of waveguide mode converters is feasible, we present in Table 1 the performance characteristics of several mode-converting structures using materials with known dielectric properties. The angle $\theta_m$ is the incident angle under the phase-matched condition. From Eqs. (5), (7), and (8), the values of $\phi_{EE}$ and $\phi_{MM}$ can be computed for a selected value of $\theta$ or $\beta$ ($=n_f \sin \theta$). The computation is repeated until $\phi^E=\phi^M$. Once $\theta_m$ is found, the value of $|r_{EM}|$ can be calculated.

Complete conversion occurs at $m|r_{EM}|=\pi/2$ when $B_m=1$ in Eq. (25). Since there are $1/(2W \tan \theta)$ mode-converting reflections in a distance $l$, the waveguide length necessary for complete mode conversion is $$l_0 = \frac{\pi W \tan \theta_n}{|r_{EM}|} \quad (26)$$

The film thickness W can be computed from Eq. (13). The mode number $q=q'$ is so chosen that W is in the neighborhood of 0.5 micron. As we can see from Table 1, the value of $l_0$ falls in a very convenient range. The dimension is small so it suits the concept of integrated optics, and yet large enough so the value of $l_0$ can be accurately controlled.

Complete mode conversion is possible only when the phase-matching condition is satisfied. If a phase mismatch $\delta\phi=\phi^M-\phi^E\neq 0$ exists, only a partial conversion can be achieved. It can be shown (Appendix 3) that a general expression for $B_m$ is $$B_m = r_{12} \sin(m\phi_2)/\sin(\phi_2) \quad (27)$$

where $\phi_2 = \cos^{-1}[r_{11} \cos(\delta\phi/2)]$. Under the phase-matched condition $\delta\phi=0$, $\phi_2=\sin\phi_2=r_{12}$ and Eq. (27) reduces to Eq. (25). For small $\delta\phi$, Eq. (27) can be approximated by $$B_m = \sqrt{\frac{G_0}{G}} \sin(m|r_{EM}|\sqrt{\frac{G}{G_0}}) \quad (28)$$

where $G_0=|r_{EM}|^2$ and $G=|r_{EM}|^2+|r_{EE}|^2(\delta\phi/2)^2$. When $\delta\phi=2|r_{EM}|/|r_{EE}|$, maximum achievable conversion (that is, maximum $B_m$) is ½ and requires a distance $l=l_0/\sqrt{2}$. Since $|r_{EE}|=1$ for most cases, a practical condition for near-complete mode conversion can be simply stated as $$\delta\phi < |r_{EM}| \quad (29)$$

Figure 10:
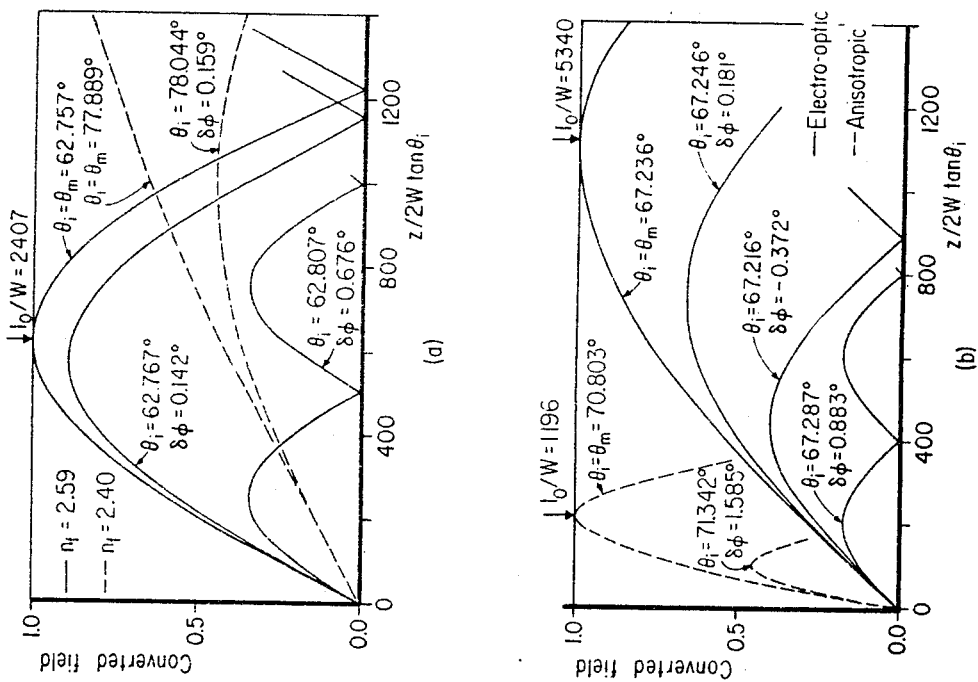
FIGS. 10 show the normalized amplitude of the converted field (or the value of $B_m$) versus normalized waveguide length $L/2W \tan \theta$ for different incident angles.

FIG. 10 shows the magnitude of $B_m$ (that is, the converted field amplitude as a fraction of the initial field amplitude) versus the distance down the waveguide under $\delta\phi=0$ and $\delta\phi\neq 0$ for several mode-converting structures. As these structures have been discussed elsewhere,[32] it suffices to point out that the behavior of mode conversion predicted by Eqs. (25) and (28) has been confirmed by computational results.

The synchronous phase condition $\delta\phi=0$ can be satisfied only at a specific incident angle $\theta_m$ for a given W. If $\theta$ deviates from $\theta_m$, there will be a cumulative phase change $\delta\phi$ between the converted fields from successive mode-converting reflections because $\delta\phi^E/\delta\theta$ and $\delta\phi^M/\delta\theta$ are different. The tolerance in incident angle misalignment can be represented by a bandwidth $\Delta\theta$ defined by the half-power points. We note from Table 1 that the values for $\Delta\theta$ are of the same order of magnitude as, or larger than, the tolerance[2] for light coupling into an optical waveguide. Therefore, the alignment necessary for mode converting should not be more difficult than for light guiding.

The tolerance set on $\Delta\theta$ automatically imposes a condition on the tolerable variation in film thickness because Eq. (13) which governs the selection of propagating TE and TM modes relates W to $\theta$. The synchronous phase condition $\phi^E=\phi^M$ is met only at a certain film thickness $W_m$. For W different from $W_m$, the incident angles $\theta_E$ and $\theta_M$ become different for the TE and TM waves in order that Eq. (13) can be satisfied. As a result, $\phi^E\neq\phi^M$ and the guided phase velocities for the TE and TM waves are different. Consider the process TE→TM conversion. The converted TM field has the phase constant $k_z^E$ of the parent TE field, and yet the eigen TM mode of the guide has a phase constant $k_z^M$. As a result of $k_z^E$ and $k_z^M$ being different, we have a problem of phase coherence. The problem is similar to that encountered in parametric interaction. In analogy, we define a coherence length $$l_c = 2\pi W_m[(2k_0 n_f W_m \cos\theta)^2 \frac{|D_M-D_E|}{D_E D_W} \frac{\delta W}{W_m}]^{-1} \quad (30)$$

such that $|n_f(\beta_M-\beta_E)k_0|l_c=\pi$. In Eq. (30), $D_E=A+\delta\phi^E/\delta\theta$, $D_M=A+\delta\phi^M/\delta\theta$, $A=2k_0 n_f W_m \sin\theta$ and $\delta W=W-W_m$. Equation (30) is obtained by finding $\delta W/\delta\theta$ from Eq. (13) and then relating $\beta_M-\beta_E$ to $\delta\theta$. For $\delta W\neq 0$, $\delta\phi$ is also nonzero and only a partial conversion is possible. The value of $B_m$ drops to $1/\sqrt{2}$ (half-power points) when $l_c=l_0$. We use this definition to calculate the bandwidth $\Delta W$, that is, the tolerance in film thickness (Table 1). With optical polishing to $\lambda/50$ being currently available, we feel that the construction of these structures, with the exception of structure 4, is feasible.

The values of $\Delta\theta$ and $\Delta W$ are influenced primarily by two factors: (1) the differential phase change $(\delta\phi^M/\delta\theta)-(\delta\phi^E/\delta\theta)$ with respect to the incident angle and (2) the magnitude of the mode-conversion factor $|r_{EM}|$. If $\delta\phi=\phi^M-\phi^E$ is less sensitive to $\theta$, the two eigen modes will remain degenerate over a wider range of $\delta$ and W. A substrate with a larger $|r_{EM}|$ requires less reflections at the film-substrate boundary to complete mode conversion. For m reflections, the cumulative phase shift is $m\delta\phi$. The converted field ceases to grow when $m\delta\phi > \pi$ or $\delta\phi > \pi/m$. Thus, for larger $|r_{EM}|$ (which means smaller m), we can allow a larger $\delta\phi$ per mode-converting reflection. This is obvious from Eq. (29). As the data in Table 1 show, substrate materials with larger off-diagonal elements should give better performance characteristics. Further, the longitudinal configuration has better performance characteristics than the polar configuration as a result of a larger $|r_{EM}|$.

Besides large off-diagonal elements, substrate materials should also have a small birefringence. If $K_{11}$ is quite different from $K_{22}$, then $K_{22}$ can be close to $\beta^2$ in Eq. (15) while $K_{11}$ is still away from $\beta^2$. A large difference between $P_1$ and $P_2$ has two effects: a large differential phase change $\delta(\delta\phi)/\delta\theta$ and a smaller $|r_{EM}|$ for the same $|K_{12}|$. Both these effects are not desirable. The poor performance of structure 4 is largely due to the large birefringence of LiNbO$_3$. The off-diagonal elements being the same, a higher $|r_{EM}|$ would require a deeper and more equal penetration of the two eigen modes into the substrate.

The choice of the film material is determined by the index of refraction. As mentioned earlier (FIGS. 4 and 9), the value of $|r_{EM}|$ increases as $\theta$ approaches the critical angle. The phase angles $\phi^E$ and $\phi^M$, however, change rapidly near $\theta_{crit}$. If we choose an $n_f$ such that $\theta_m$ is close to $\theta_{crit}$, we raise not only the value of $|r_{EM}|$ but also the value of $\delta(\delta\phi)/\delta\theta$. We find that the performance of a mode converter improves as $\theta_m$ and $\theta_{crit}$ move toward each other. However, when $\theta_m$ approaches either the critical angle of the substrate or the top layer, we witness a trade-off between $|r_{EM}|$ and $\delta(\delta\phi)/\delta\theta$. The crystal SBN has a relatively large off-diagonal elements, and yet structure 7 has relatively small tolerances. The reason is that $\theta_m$ is within one degree of the critical angle at the substrate-film boundary.

The importance of selecting film index can be seen by comparing $\Delta\theta$ and $\Delta W$ of structures 7 and 9. We can rewrite Eq. (29) as $\Delta\theta < |r_{EM}|/(\delta\phi/\delta\theta)$. The value of $(r_{EM})_L$ is larger than $(r_{EM})_P$ by a factor of about 6 under similar operating conditions. If the same film index $m_f = 2.39$ were used in the polar configuration, we would expect a value of about 0.4° for $\Delta\theta$. In Eq. (30), since $l_0$ is proportional to $|r_{EM}|$, the main factor in determining $\Delta W$ is also $|r_{EM}|/(\delta\phi/\delta\theta)$. Therefore, a value of about 450 A for $\Delta W$ should be possible.

From the several mode-converting structures shown in Table 1, it appears optimum to have the film and top-layer indices so chosen that $\theta_m$ is above 75° and the difference $\theta_m - \theta_{crit}$ is about 4°. The small tolerances for structure 8 are largely due to the field-induced anisotropy is KTN which makes phase-matching difficult. By reducing the bias field by a factor of 3, we can almost restore isotropy in KTN, and still have a relatively large value of $K_{23} = 2.23 \times 10^{-3}$. With this relaxation on the requirement of the top-layer anisotropy, it should be possible to improve the performance of structure 8.

Now, we comment on the selection of the scheme for phase compensation. As discussed in Sec. IV, the two possible schemes are: (1) a positive uniaxial crystal oriented with $K_{11} = K_{22} < K_{33}$ and (2) a positive or negative uniaxial crystal oriented with $K_{11} > K_{22}$. The phases $\phi^E$ and $\phi^M$ vary more equally in the case with $K_{11} = K_{22}$ than in the case with $K_{11} > K_{22}$ as it is obvious from: Eq. (15). Therefore, scheme 1 is expected to yield much larger tolerances in $\Delta\theta$ and $\Delta W$ than scheme 2. Calculations based on scheme 1 for GdIG mode converter show that an improvement by a factor of 10 would be obtained if a hypothetical crystal with a relatively large birefringence were used. The requirement on birefringence can be relaxed somewhat by making $P_E$ and $P_M$ small. Since common positive uniaxial crystals do not have a large birefringence (with tellurium being a notable exception), we have used scheme 2 for phase compensation. Scheme 2 has a requirement on birefringence which most uniaxial crystals can meet. However, scheme 1 may be useful in other wavelength regions were suitable positive uniaxial crystals should become available.

Figure 11:
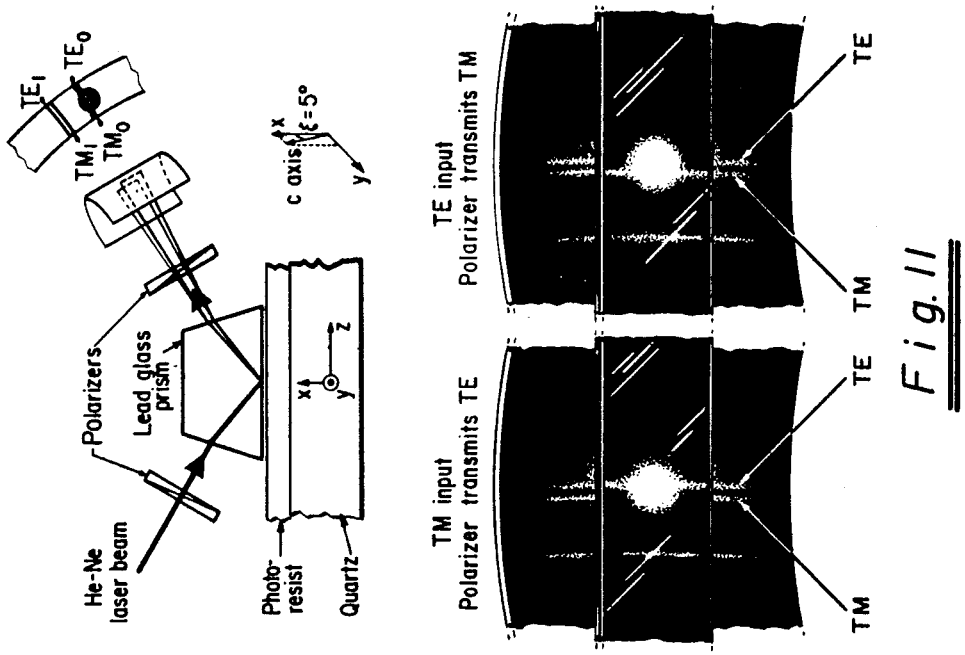
FIG. 11 depicts a light-coupling apparatus (a) experimental apparatus of a polarization converter constructed in accordance with the present invention and (b) photographs showing the waveguide mode lines resulting from operation of the apparatus of FIG. 11a. The two lines close together are the mode lines for the two near-degenerate TE and TM modes. One line was partly blocked by a polarizer for identifying the polarization. The photograph on the right (left) was taken when the input beam had a TE (TM) polarization and the output beam with the TE (TM) polarization was partially blocked. The fuzziness of the lines was due to nonuniform thickness of the photoresist film which was not polished.

As a preliminary test of the theory, we have performed a light-coupling experiment (FIG. 11) on a waveguide made of isotropic photoresist film and anisotropic quartz substrate. A He-Ne laser beam was coupled into and out of the waveguide through an isotropic Pb-glass prism. The use of isotropic materials for the film and prism removes any ambiguity as to the origin of polarization conversion observed in the experiment. The quartz crystal was oriented in the longitudinal configuration with its c-axis lying in the xy plane and making an angle of 5° with the normal of the film surface. Since the case is similar to structure 1 of Table 1 with a film index ($n_f = 1.6$) close to the indices of quartz, a large tolerance $\Delta W$ is expected. This large tolerance should result in a near-degenerate operation of the TE and TM modes, ensuring a significant polarization conversion.

TABLE 1

| Directions | Materials Substrate | Film | Top Layer | $\lambda$ (x) | $\theta_m$ (deg.) | $\|r_{EM}\|$ $10^{-3}$ | q | W (x) | $l_0$ (mm) | $\delta\theta$ (deg.) | $\delta W$ (A) |
|---|---|---|---|---|---|---|---|---|---|---|---|
| (1) L, A | quartz (a) | flint glass (b) | crown glass (c) | 0.6328 | 79.41 | 16.0 | 0 | 0.622 | 0.65 | 2.14 | 4589 |
| (2) F, A | calcite (d) | Pb glass (e) | crown glass (e) | 0.6328 | 77.55 | 4.51 | 0 | 0.610 | 3.15 | 1.28 | 1160 |
| (3) L, N-O | FIG (f) | As$_2$S$_3$ glass (g) | LiNbO$_3$ (h) | 1.152 | 77.90 | 0.705 | 0 | 0.665 | 13.8 | 0.155 | 306 |
| (4) L, E-O | LiNbO$_3$ (i) | CdS (j) | Ta$_2$O$_5$ (k) | 0.6328 | 70.80 | 0.715 | 1 | 0.581 | 7.34 | 0.051 | 32 |
| (5) L, N-O | FeSO$_3$ (l) | AgCl (m) | Pb glass (c) | 0.5250 | 82.75 | 12.2 | 0 | 0.721 | 1.45 | 2.78 | 5688 |
| (6) F, N-O | FeSO$_3$ (l) | AgCl (m) | Pb glass (e) | 0.5250 | 82.75 | 1.86 | 0 | 0.721 | 9.58 | 0.42 | 838 |
| (7) F, E-O | SBN (n) | CdS (j) | Ta$_2$O$_5$ (k) | 0.6328 | 70.60 | 2.96 | 1 | 0.525 | 1.58 | 0.060 | 66 |
| (8) F, E-O | KTN (O) | TiO$_2$ (p) | PbMnO$_4$ (q) | 0.6328 | 66.04 | 6.71 | 2 | 0.700 | 0.74 | 0.188 | 132 |

TABLE 1-continued

| Directions | Materials Substrate | Film | Top Layer | λ (x) | $\theta_m$ (deg.) | $|r_{EM}|$ $10^{-3}$ | q | W (x) | $l_0$ (mm) | $\delta\theta$ (deg.) | $\delta W$ (Å) |
|---|---|---|---|---|---|---|---|---|---|---|---|
| (9) L, E-O | SBN (r) | $n_f = 2.39$ | $Ta_2O_5$ (k) | 0.6328 | 78.66 | 22.0 | 0 | 0.388 | 0.27 | 2.44 | 3197 |

The performance characteristics of several mode-converting structures. The various symbols have the following meaning:
L for longitudinal configuration,
P for polar configuration,
A for anisotropic substrate,
N-O for magnetooptic substrate,
E-O for electrooptic substrate,
λ for the wavelength, and
q-q' for the mode number in Eq. (13).
The mode conversion factor $|r_{EM}|$ is expressed in units of $10^{-3}$. The other symbols are defined in the text.
The data for the permittivity tensor are as follows:
(a) quartz,[23] $K_{11} = 2.409$, $K_{22}-K_{33} = 2.381$, $K_{12} = 2.45 \times 10^{-3}$ (c-axis of quartz 5° from the x direction in xy plane);
(b) flint glass,[24] $n_f = 1.6$;
(c) crown glass,[24] $n_f = 1.5$;
(d) calcite,[25] $K_{11} = 2.739$, $K_{22} = 2.206$, $K_{33} = 2.738$, $K_{23} = 1.86 \times 10^{-2}$ (c-axis of calcite 2° from the y direction in yz plane);
(e) Pb glass,[23] $n_f = 1.8$;
(f) FIG.[15,26] $K_{11} = K_{22} = K_{33} = 5.29$, $K_{12} = 3 \times 10^{-4}$;
(g) $As_2S_3$ glass,[24] $n_f = 2.40$;
(h) $LiNbO_3$,[16] $K_{11}-K_{33} = 4.968$, $K_{22} = 4.623$;
(i) $LiNbO_3$,[16] $K_{11}-K_{33} = 5.275$, $K_{22} = 4.876$, $K_{12} = 6.6 \times 10^{-4}$ at a bias field of 10 KV/cm;
(j) CdS,[27] $n_f = 2.50$;
(k) $Ta_2O_5$,[28] $n_f = 2.20$;
(l) $FeSO_3$,[29] $K_{11}-K_{33} = 4.20$, $K_{22} = 4.16$, $|K_{12}| = 2.96 \times 10^{-3}$ in (5) and $|K_{23}| = 2.96 \times 10^{-3}$ in (6);
(m) AgCl,[30] $n_f = 2.09$;
(n) $Sr_{0.75}Ba_{0.25}Nb_2O_6$,[19] $K_{11}-K_{33} = 5.34$, $K_{22} = 5.27$, $K_{23} = 7.7 \times 10^{-3}$ at a field of $10^3$ volts/cm;
(o) $K Ta_{0.65}Nb_{0.35}O_3$,[20] $K_{11} = 5.23$, $K_{22} = 5.33$, $K_{33} = 5.25$, $K_{23} = 2.02 \times 10^{-2}$ at the saturation field applied in the direction bisecting the y and z axes;
(p) amorphous $TiO_2$,[24] $n_f = 2.59$;
(q) $PbMeO_4$,[31] $K_{11}-K_{33} = 5.475$, $K_{22} = 5.244$;
(r) $Sr_{0.75}Ba_{0.25}Nb_2O_6$,[19] $K_{11}-K_{33} = 5.34$, $K_{22} = 5.27$, $K_{12} = 7.7 \times 10^{-3}$ at a field of $10^3$ volts/cm.

As can be seen from FIG. 11b, there was indeed a significant polarization conversion. The fact that the two TE and TM mode-lines were close together indicates that the two modes were nearly degenerate. In our experimental procedure, the waveguide was first decoupled from the prism by releasing the pressure on the substrate, and the polarization of the input beam was so adjusted that the polarization of the output beam was purely TE or TM. Then the waveguide was pressed back against the prism to obtain mode coupling, and the mode-lines were analyzed for their polarization by a polarizer. The simultaneous presence of the two TE and TM lines close together, when the input beam had pure TE or TM polarization, strongly suggests that significant polarization conversion had taken place. A similar experiment with an isotropic glass slide ($n_s = 1.52$) as the substrate was performed, and only mode-lines with a polarization identical to the input-beam polarization were observed.

In the foregoing analysis, use was made of the concepts of geometrical optics to explain this invention. Such an explanation is taken from a point of view using reflection from the boundaries of the waveguide and the adjacent anisotropic or gyrotropic material. The following discussion will generalize the foregoing by making use of a wave optics point of view and therefore will facilitate the understanding and application of the invention to a wider range of possible structures.

In wave optics, wave propagation in the waveguide can be described by two eigen modes herein referred to as mode A and mode B. Away from the phase-matching condition, the A and B modes have pure TE and TM polarization as a limit; for example, A mode is pure TE, and B mode is pure TM or vice versa. Near the phase-matching condition, the interaction between the TE and TM polarization becomes so strong that the A and B modes contain a substantial amount of the other polarization. When the phase-matching condition $\phi^E = \phi^M$ is satisfied, the TE and TM contents in the A and B modes are nearly equal. Under the circumstances one can express the complex amplitudes of the two modes as $$A = a_1(TE) + a_2(TM)exp(i)exp(i\omega t - ik_z^A z)$$

$$B = b_1(TE) - b_2(TM)exp(i)exp(i\omega t - ik_z^B z)$$

where either $a_2/a_1 = b_2/b_1 = 1$ or $a_2/a_1 = b_2/b_1 = i$. The A and B modes have different phase velocities $\omega/k_z^A$ and $\omega/k_z^B$. As the two modes propagate in the waveguide, the composition of the resultant wave changes with distance. For example, when $(k_z^A - k_z^B)z = $ even multiple of $\pi$ the resultant wave $A + B$ becomes pure TE due to mutual cancellation of the TM components over the properly chosen interaction length.

The above concludsion based on wave-optics analysis is perfectly general, irrespective of which medium (the substrate, the film or the top layer) is made of material capable of coupling the TE and TM polarization. In other words, wave-optics analysis predicts TE to TM or TM to TE conversion in optical waveguides where one of medium has off-diagonal permittivity tensor elements. The conversion from one polarization to the other is nearly complete if $\phi^E = \phi^M$.

As used herein and in the claims, anisotropic and gyrotropic should be taken as subclassifications of materials whose propagation characteristics for electromagnetic waves are polarization dependent. A more complete classification is as follows.

Anisotropic materials refer to those in which wave propagation is described by linearly polarized waves. Anisotropic materials are also characterized in that the off-diagonal elements of the associated permittivity tensor are real and/or the on-diagonal elements are unequal.

Anisotropic materials may be either inherently anisotropic or may be induced by application of external fields. Examples of inherently anisotropic materials including quartz and calcite. Examples of induced anisotropic materials include the electro-optic materials:

Lithium niobate and LiTaO$_3$; and the photo-elastic materials: silicon, GaAs and rocksalt.

Gyrotropic materials refer to those in which wave propagation is described by circularly polarized wave and are further characterized in that the off-diagonal elements of the permittivity are purely imaginary. Gyrotropic materials may be further classified as those which are inherently so, commonly known as optically active materials and those which may be induced to become so, commonly known as magneto-optic materials. Examples of inherently optically active materials include: quartz and lactic acid in liquid solution. Examples of induced gyrotropic materials or magneto-optic materials include the following: YIG (Yttrium iron garnet) and mixed magnetic garnet EuEr$_2$Fe$_4$GaO$_{12}$.

It will be noticed that in the examples given for induced anisotropic and induced gyrotropic materials the anisotropic case is generally developed by the application of electric fields, or mechanical fields such as mechanical stress, while the gyrotropic case is generally induced by the application of magnetic fields.

The foregoing objects and features of the present invention will become apparent from the following description of particular devices when taken in conjunction with the remaining accompanying drawings and claims.

BRIEF DESCRIPTION OF THE FIGURES (CONT.)

FIG. 1b shows a cross section of a mode converter constructed in accordance with the present invention.

FIGS. 2 through 12 have been previously described.

Figure 13:
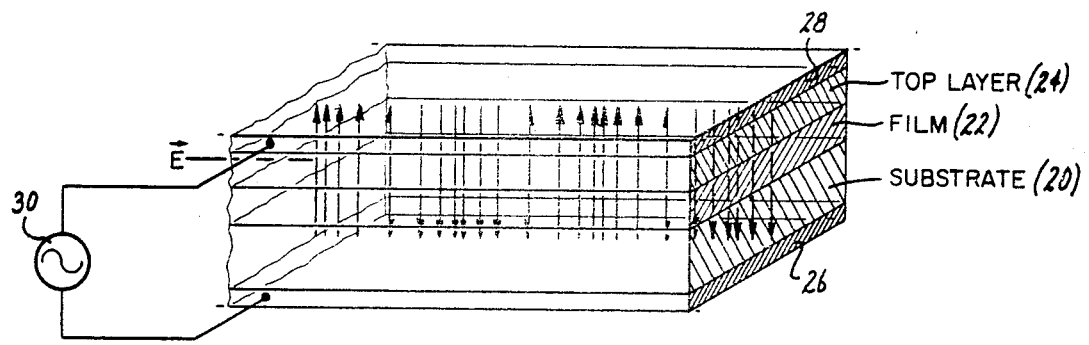

FIG. 13 is a schematic perspective view illustrating a mode converter using microwave biasing field constructed in accordance with the present invention.

Figure 14:
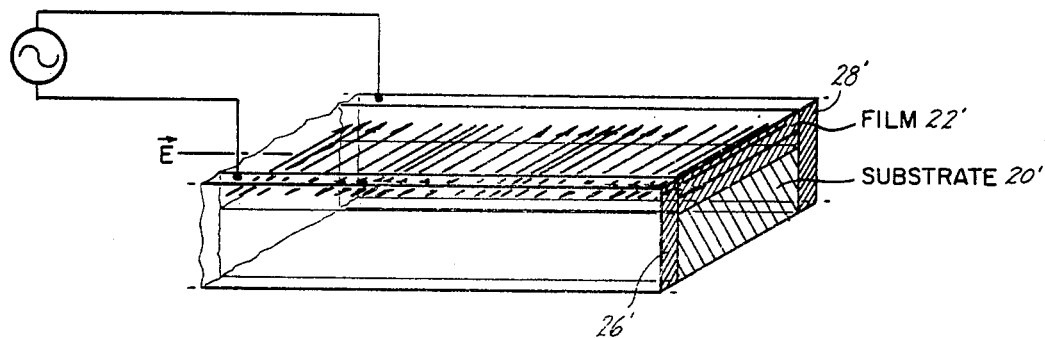

FIG. 14 is a schematic perspective view illustrating the mode converter using a microwave and biasing field of different field orientation, and constructed in accordance with the present invention.

Figure 15:
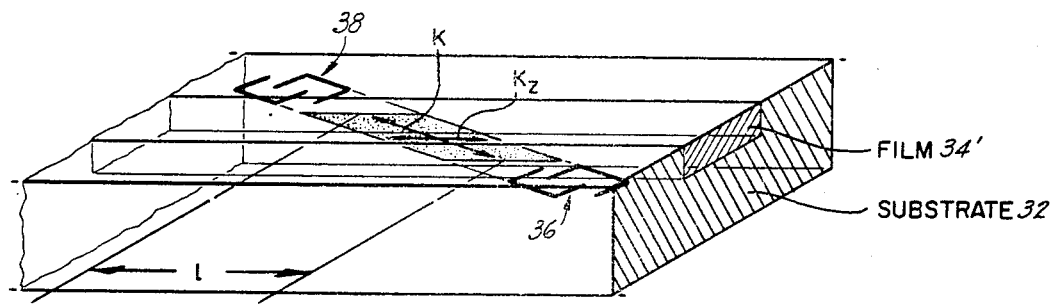

FIG. 15 is a schematic perspective view illustrating a mode converter constructed in accordance with the present invention and using an acoustic biasing field.

Figure 16:
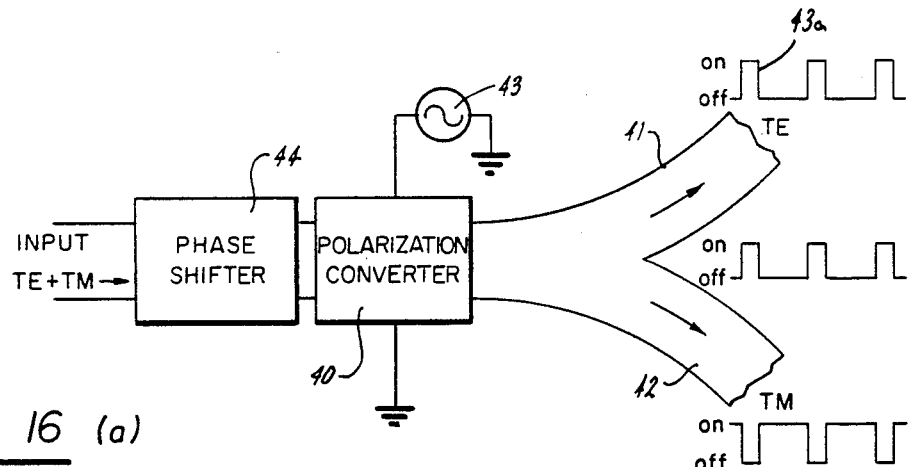
Figure 16:
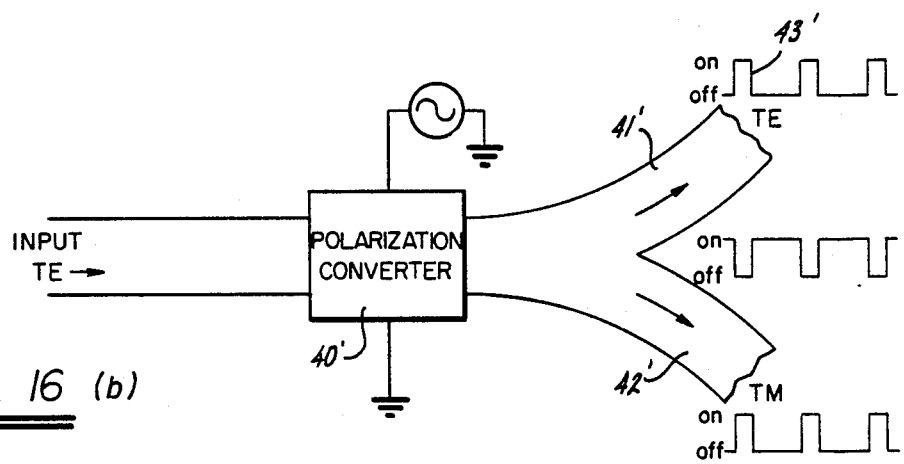

FIG. 16 is a schematic diagram of optical waveguide switches constructed in accordance with the present invention and employing a polarization converter as disclosed herein.

Figure 17:
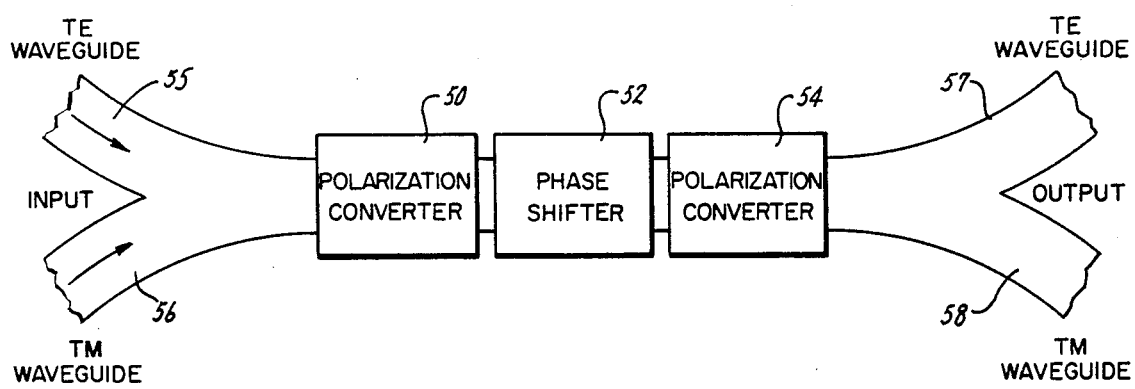

FIGS. 17 are (a) a schematic diagram of an optical waveguide gyrator constructed in accordance with the present invention, (b) the functional structure, (c) the input-output relation and (d) the circuit representation of a thin-film-waveguide gyrator. The magnetic and dielectric mode converters must form a complementary pair.

FIG. 18 is a schematic diagram of an optical waveguide isolator constructed in accordance with the present invention.

Figure 19:
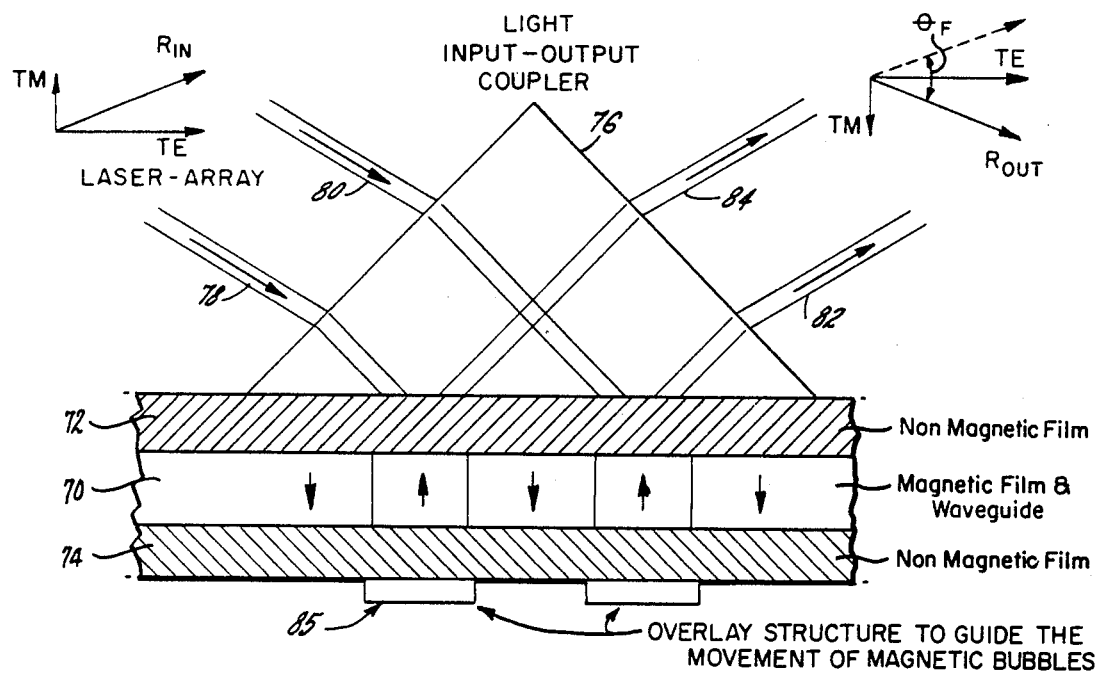

FIG. 19 is a cross sectional view of an optical readout and magnetic memory constructed in accordance with the present invention.

Figure 20:
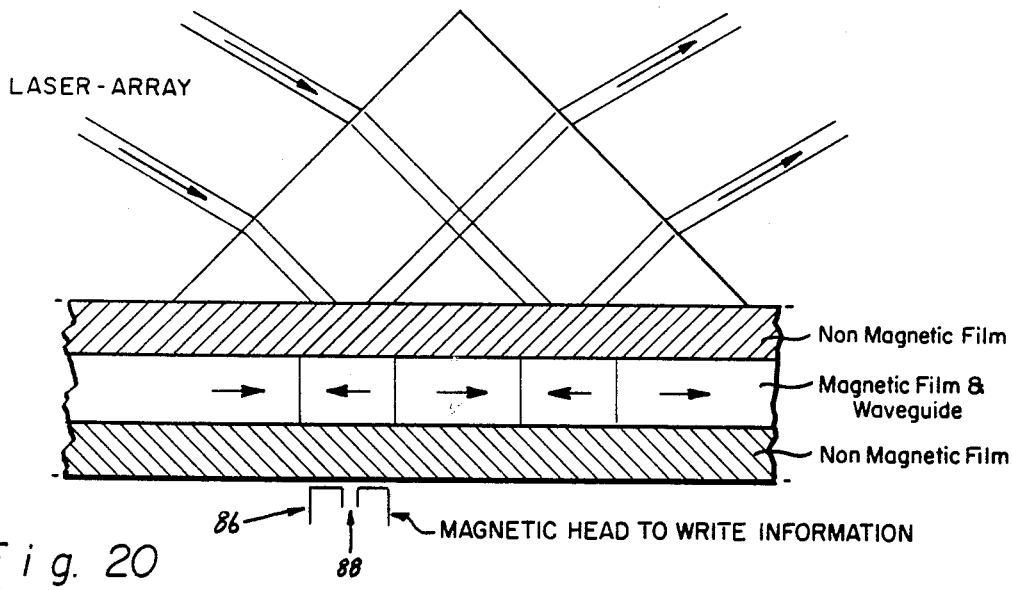

FIG. 20 is a cross sectional view of another form of optical readout and magnetic memory constructed in accordance with the present invention.

DETAILED DESCRIPTION OF THE PREFERRED EMBODIMENTS

Referring again to FIG. 1b one can now generalize the nature of the polarization converter constructed in accordance with the present invention as consisting of a substrate layer 16 which serves as support for the converter and which possesses a predetermined permittivity tensor $\vec{\epsilon}_s$. Upon this substrate is disposed, in intimate contact, a thin film optical waveguide 14 which also possesses a predetermined permittivity tensor $\vec{\epsilon}_f$. Above this layer is disposed means 18 having a predetermined permittivity tensor $\vec{\epsilon}_t$. The latter means forming the top layer may consist of a material or may be, for example, air. In some circumstances, it is envisaged that this means may consist of the absence of any material as, for example, a vacuum. In the sense of the present application, a vacuum defines a permittivity tensor as well as an index of refraction and is capable of supporting the propagation of electromagnetic waves and accordingly can be useful in certain applications of the invention as, for example, in outer space. While the foregoing discussion defines each of the layers as having a certain permittivity tensor it will be understood that such a characterization is necessitated by the requirement that one of the layers be anisotropic or gyrotropic and therefore polarization dependent.

In the more common sense, each of the substrate and top layers must possess an index of refraction which is less than that of the thin film layer so that the necessary condition for the establishment of the thin film layer as a waveguide having reflective boundaries can be met. In a more general and precise sense this same condition can be stated as follows: that the permittivity tensor $\vec{\epsilon}_f$ of the film has certain diagonal elements which control the propagation of the wave and that these diagonal elements are selected to be greater than the corresponding diagonal elements of the permittivity tensors $\vec{\epsilon}_t$ and $\vec{\epsilon}_s$. In the context of the present application, this requirement defines the waveguide. One of the layers, either the waveguide itself or the substrate or the top layer, is made of a material having propagation characteristics which are polarization dependent to thereby cause coupling between the TE and TM polarizations of the wave propagated in the waveguide. This also establishes two eigen modes of propagation through the waveguide each of which is a combination of TE and TM polarization waves, as previously discussed. These eigen modes have different phase velocities and accordingly are found to add and subtract from each other at intervals. The waveguide film 14 is made with a thickness such that the phase-matched condition $\phi^E = \phi^M$ is satisfied, and the two eigen modes therefore contain nearly equal TE and TM components. In addition, the material having the anisotropic or gyrotropic property is made with a length, herein called interaction length, such that the relative phase of the eigen modes changes over said length and cuases mutual cancellation of either the TE or TM components from both of the modes. Accordingly, conversion of TE to TM or TM to TE waves results as they are propagated through an interaction length, l, of this material. As previously discussed, the material having the property of propagation characteristics which are polarization dependent can be anisotropic or gyrotropic, either induced or inherently so.

Once the principle of polarization conversion in optical waveguides is known it can be extended to cases which are similar but have not been discussed in the present mathematical analysis. One obvious extension is the case where the film, instead of the substrate, is made of material capable of coupling the two polarizations. For this case, the fields in the substrate can be described as pure TE and TM waves, and the fields in the film can be described as TE-rich (with $E_y$ being large and $E_x$ and $E_z$ being small) and TM-rich (with $E_x$ and $E_z$ being large and $E_y$ being small) waves. Therefore, this situation is analogous to the one already analyzed except that the nature of the fields in the film and the substrate is interchanged. For waveguide polarization-converters using anisotropic gyrotropic, magneto-optic, or electro-optic material for the film, the condition for complete polarization conversion is:

$$\phi_{EE} + \phi_E = \phi_{MM} + \phi_M - \phi_{dM}$$

which is a generalization of Eq. (17).

Another interesting extension is shown in FIGS. 13 and 14 where the applied bias electric field is of high frequency (microwave) instead of d-c or zero frequency as assumed in the mathematical analysis. Thus, a mode converter such as in FIG. 13 including a substrate 20, waveguide layer 22 and top layer 24 is sandwiched between the conductive strips 26, 28 of a microwave strip line to which a microwave source 30 is connected.

The $\vec{E}$ field lines are shown diagramatically as extending between the strips, their closeness of spacing indicating the strength of the field. Since the strips are above and below the plane of the mode converter the E field lines pass normal to that plane. FIG. 14 shows another arrangement in which the conductive strips 26', 28' of the strip line are disposed on each side of the mode converter so that the E field is oriented in alignment with the plane of the waveguide. Both of the structures of FIGS. 13 and 14 make use of electro-optic materials in one of the layers 20,22,24.

For example, if a microwave bias field is used, then the condition for phase synchronism in the z direction becomes $$\vec{k}_z^E - \vec{k}_z^M = \pm \vec{K}_z$$

instead of $$\vec{k}_s^E - \vec{k}_z^M = 0$$

for the d-c or zero frequency case, where $\vec{k}_z$ is the wave vector of the microwave bias field. It is also possible to use photoelastic effect to produce polarization conversion when an acoustic or elastic wave is present. For this case, $\vec{K}_z$ om Eq. (17b) is the wave vector of the acoustic or elastic wave. For nonzero $K_z$ the condition for complete conversion becomes:

$$\delta\phi = (\phi_{EE} + \phi_E - \phi_{dE}) - (\phi_{MM} + \phi_M - \phi_{dM})$$

The requirement is that $\delta\phi$ be very small but not zero. Once a mode-converting structure is made, the values of $\phi_{EE} + \phi_E - \phi_{dE}$ and $\phi_{MM} + \phi_M - \phi_{dM}$ are fixed and so are the values of $k_s^E$ and $k_z^M$ which are now unequal.

For complete polarization conversion, we choose the frequency of the microwave bias field such that Eq. (17b) is satisfied. These arrangements have two obvious advantages over the arrangement using a d-c bias field. First the mode converter can be operated at a high modulating frequency. Second, the tolerance in the film thickness is greatly relaxed because we now have the additional flexibility of using the modulating frequency or $K_z$ as an adjustable parameter in satisfying the condition for complete polarization conversion.

The same arrangements employing microwave strip lines can also be used for polarization converters made of magneto-optic materials. In this case, the microwave magnetic field induces off-diagonal elements in the permittivity tensor to cause coupling between the TE and TM waves. FIG. 15 shows a possible arrangement for a polarization converter using the photo-electric effect.

Thus a mode converting structure is provided consisting of a substrate 32 on which an optical waveguide 34 is disposed. The top layer can be air. The substrate 32 is made of a photo-electric material and extends laterally away from and on each side of the waveguide. Menas are provided for establishing an acoustic wave field over a certain length of the converter and include a pair of acoustic transducers 36, 38 disposed in coupled relation to the substrate on opposite sides of the waveguide. The transducers are mounted at spaced locations with respect to the orientation of the waveguide so that the resultant acoustic wave vector $\vec{K}$ makes an angle to the wave vector $\vec{K}_z$ in the waveguide and therefore defines an average interaction length l. An elastic wave is launched into the substrate through the use of an acoustic wave transducer. A standing wave pattern of stress field is set up between the two launchers particularly in the region of the interface between the waveguide and the substrate. It is desirable to have the acoustic wave vector making a slight angle with the direction of light wave propagation so that the intersection of the acoustic wave front with the light waveguide clearly defines a region of interaction between the stress wave and the light wave. The length of this interaction region determines the interaction length.

Thus, a thin-film optical waveguide as in FIG. 1b using electro-optic substrate results in a mode converter from which the output polarization TM or TE can be switched by the application of a bias electric field. Such a mode conversion device can also be used to combine two signals originally entering the waveguides as TE and TM modes into a single mode either TE or TM for signal processing as will be now discussed.

Referring to FIG. 16a there is shown a polarization converter 40 located in an optical waveguide which terminates in TE and TM channels 41, 42 which are mutually exclusive, that is to say which only transmit TE or TM waves exclusively and reject the opposite wave. Input light waves are launched through the device from the opposite side. Means are provided for supplying a bias electric field which can be controlled either by being reversed or by having a two valued output as indicated at 43a. A phase shifter 44 will usually have to be employed between the input and the converter in order to assure proper phase relationship between the TE and TM waves before they enter the converter. For example, from Eq. (23a), we have $$(TE)_{2m} = A_m(TE)_0 + B_m \exp(i\alpha)(TM)_0 \quad (31)$$

An interesting case is one in which $(TM)_0 = (TE)_0 \exp(-i\alpha)$ through the adjustment of the phase shifter 44. If the converter is operated at the half-conversion point, then $A_m = 1/\sqrt{2}$ and $B = \pm 1/\sqrt{2}$ depending on the direction of the bias field. For $B_m = -1/\sqrt{2}$, $(TM)_{2m} = (TE)_0$. In other words, the incoming signal contains equal TE and TM signals. Each of these is split after passing through the converter at half conversion into four equal energy TE and TM components. Since the phase is controllable, these split signal components are combinable to cancel either polarization leaving TE or TM as the output wherever the applied biasing signal is present.

FIG. 16b shows a similar arrangement operated at full conversion, like parts being similarly designated with the addition of the prime ('). If an input TE wave is supplied, the output will be TE when the converter is off, and will be TM when the converter is on. Initially this provides for selection of wave types, and after passage through the branch channels 41', 42' results in the signal in either branch being alternately "on" or "off" depending on the state of the applied bias field.

The polarization converter thus conceived has an important property, that is, nonreciprocal propagation characteristics. There are four possible configurations of the polarization converter: (1) longitudinal (with off-diagonal elements in the transverse plane) gyrotropic, including magneto-optic, (2) polar (with off-diagonal elements in the longitudinal plane) gyrotropic, (3) longitudinal anisotropic, and (4) polar anisotropic. Wave propagation in a mode-converting waveguide can be described by a 2×2 scattering matrix. If the wave reverses its direction of propagation, the off-diagonal elements change their sign in configurations (1) and (4) but remain the same in configurations (2) and (3). Using the foregoing it is possible to obtain realization of optical gyrator and isolator. The gyrator and isolator were made practical devices first in the microwave region.[33] The use of the Faraday effect for signal isolation was later extended to the optical region[34, 35] for conventional laser systems. Here it is proposed to use the nonreciprocal nature of waveguide mode-converters to accomplish these circuit functions for use in integrated optics.

For nonreciprocal device applications, the following observation is useful. The multiple scattering matrices presented in Sec. V can be classified into two groups: $[r]_I$ and $[r]_{II}$.

$$[r]_I = \begin{bmatrix} A_1 & B_1\exp(i\alpha_1) \\ -B_1\exp(-i\alpha_1) & A_1 \end{bmatrix} \quad (32a,b)$$

$$[r]_{II} = \begin{bmatrix} A_2 & i\,B_2\exp(i\alpha_2) \\ i\,B_2\exp(-i\alpha_2) & A_2 \end{bmatrix}$$

with $[r]_I$ for the longitudinal magnetic and polar dielectric cases and $[r]_{II}$ for the polar magnetic and longitudinal dielectric cases. The sign of B changes for both the longitudinal magnetic and dielectric cases and remains the same for both the polar magnetic and dielectric cases if the wave reverses its direction of propagation. This sign reversal or constancy can be seen from Eq. (7) as $\beta$ changes to $-\beta$. The sign of B changes, of course, if the sign of $K_{12}$ or $K_{23}$ changes when the applied bias field reverses its direction.

In the magneto-optic and electro-optic cases, the sign of $K_{12}$ or $K_{23}$ is fixed once the direction of the bias magnetic or electric field is specified. To visualize the situation in an anisotropic medium, we refer to FIG. 10. The three principal crystal axes are chosen that $\epsilon_a = \epsilon_0 K_1$, $\epsilon_b = \epsilon_0 K_2$, and $\epsilon_c = \epsilon_0 K_3$. For simplicity, we consider the case in which the coordinate x and y axes are chosen as the axes bisecting the angles between $\bar{a}$ and $\bar{b}$. It can be shown by matrix transformation that the relative permittivity tensor is given by $[K]_a$ of FIG. 12 in the chosen coordinate system (x, y, z) with $K_{11} = (K_1 + K_2)/2$ and $K_{12} = (K_2 - K_1)/2$.

If we keep the same coordinate system for waves propagating in the +z and −z direction, the permittivity tensor remains the same but the sign of $\beta$ changes for the two waves. On the other hand, if we keep $+\beta$ for both waves, then the coordinate axes must change from (x,y,z) to (x',y',z') with z' in the −z direction. Note that waves propagating in the −z direction are still incident on the film-substrate boundary from the film side. Therefore, x'=x and we must make y'=−y in order to have a right-hand coordinate system. In the coordinate system (x',y',z'), the permittivity tensor is given by $[K]_b$ of FIG. 12. This analysis shows that we must change either the sign of $K_{12}$ or that of $\beta$ in Eq. (7). In either case, the sign of $(r_{EM})_L$ changes if the wave reverses its direction of propagation. By the same reasoning, the sign of $K_{23}$ remains unchanged for the polar configuration.

Now we refer to the arrangement of FIG. 17a in which a gyrotropic (or more specifically magnetic) mode converter 50, a phase shifter 52, and an anisotropic (or more specifically dielectric) mode converter 54 are arranged in tandem. Mutually exclusive waveguide pairs 55,56 and 57,58 are connected at each end of the unit. To be more specific, we further assume that the mode converters 52,54 are operated in the longitudinal configuration. Thus, the magnetic and dielectric mode converters can be represented by $[r]_I$ and $[r]_{II}$, respectively. For the phase shifter, we let the scattering matrix be $[r]_{III}$ $$= \begin{bmatrix} 1 & 0 \\ 0 & \exp(i\alpha') \end{bmatrix}.$$

For waves propagating in the +z direction, the resultant matrix is $$[R] = [r]_{II}[r]_{III}[r]_I = \begin{bmatrix} R_{EE} & R_{EM} \\ R_{ME} & R_{MM} \end{bmatrix} \quad (33)$$

For waves propagating in the −z direction, we have two changes. First, the signs of $B_1$ and $B_2$ in $[r]_I$ and $[r]_{II}$ change as $k_z$ changes from $\beta$ to $-\beta$ for both longitudinal magnetic and dielectric cases. We denote the new matrix by $[r]_I'$ and $[r]_{II}'$. Second, the order of multiplication is reversed. Thus, we have $$[R'] = [r]_I'[r]_{III}[r]_{II}' = \begin{bmatrix} R'_{EE} & R'_{EM} \\ R'_{ME} & R'_{MM} \end{bmatrix} \quad (34)$$

If we have a complementary pair of magnetic and dielectric mode converters such that $A_1 = B_1 = A_2 = B_2 = 1/\sqrt{2}$ and $\alpha_1 = \alpha_2 = \alpha$ and if $\alpha' = 90°$, then the two matrices reduce to $$[R] = \begin{bmatrix} 1 & 0 \\ 0 & i \end{bmatrix}, [R'] = \begin{bmatrix} 0 & -i\exp(i\alpha) \\ \exp(-i\alpha) & 0 \end{bmatrix} \quad (35a,b)$$

Therefore, for waves propagating in the +z direction, the TE wave remains a TE wave and the TM wave remains a TM wave. For waves propagating in the −z direction, however, the incoming TE wave changes into an outgoing TM wave and the incoming TM wave changes into an outgoing TE wave. This situation is schematically illustrated in FIG. 17c. As we can see, such a device behaves like a gyrator.

We should point out that a complementary pair of mode converters together with a phase shifter can also be operated in the polar configuration. The choice between longitudinal and polar configuration depends on the relative ease in depositing the film and in applying the bias fields. it is also possible to form a complementary pair without the phase shifter. The possible combinations are (1) a longitudinal magnetic mode converter and a polar dielectric mode converter and (2) a polar magnetic mode converter and a longitudinal dielectric mode converter. Take case (1) as an example. For a dielectric polar mode converter, $$[r]_{IV} = \begin{bmatrix} A_2 & B_2 \exp(i\alpha_2) \\ -B_2 \exp(-i\alpha_2) & A_1 \end{bmatrix} \quad (36)$$

which is the same for both directions of propagation. Thus, a combination of I and IV gives the following characteristics:

$$[R] = [r]_I [r]_I + \begin{bmatrix} 0 & \exp(i\alpha) \\ -\exp(-i\alpha) & 0 \end{bmatrix} \quad (37a)$$

for waves propagating in the $+z$ direction and $$[R]' = [r]_I'[r]_{IV}' = \begin{bmatrix} 1 & 0 \\ 0 & 1 \end{bmatrix} \quad (37b)$$

for waves propagating in the $+z$ direction. Equation (37) is obtained under the complementary-pair condition that $\alpha_1 = \alpha_2$, $A_1 = A_2 = 1/\sqrt{2}$, and $B_1 = B_2 = 1/\sqrt{2}$.

By a complementary pair of polarization converters is meant that each one of the pair splits the energy of each component of the incoming wave into one-half TM and one-half TE waves. In addition, the relative sign of the TE and TM components passing through one of the pairs remains unchanged as a function of direction of passage of the wave; while the relative sign of the TE and TM components of the other of the pair reverses when the direction is reversed. Each of the complementary pairs listed have this property. If the phase mode is correct or if a phase shifter is employed between the pair the arrangement will first turn a TE wave, for example, entering the input into equal $TE_1$ and $TM_2$ waves and then split them again into $TE_{12}$ and $TM_{12}$ waves and into $TE_{22}$ and $TM_{22}$. By adjusting the relative phase of these components $TE_{12}$ and $TE_{22}$ add, while $TM_{12}$ and $TM_{22}$ substract or cancel.

For a TE wave entering from the output or right side, the effect is similar except that the $TE_{12}$ and $TE_{22}$ wave cancel while the $TM_{12}$ and $TM_{22}$ waves add.

In summary, the four useful combinations of the various configurations are:

(A) A longitudinal gyrotropic mode converter + a phase shifter + a longitudinal anisotropic mode converter
(B) A polar gyrotropic mode converter + a phase shifter + a polar anisotropic mode converter
(C) a longitudinal gyrotropic mode converter + a polar anisotropic mode converter
(D) a longitudinal anisotropic mode converter + a polar gyrotropic mode converter If the waveguide length is chosen properly, the polarization of the wave remains unchanged (say, TE→TE and TM→TM) for one direction (say, from right to left) of propagation but changes to the other polarization (say, TE→TM and TM→TE) for the other direction (say, from left to right) of propagation.

It is well known in microwave circuitry that one can make an isolator out of a gyrator. Absorbers 60, 61 are loaded into the TM waveguides 56, 58 at the two ends of the gyrator as shown in FIG. 18 so that only one polarization mode (say, TE) is allowed to propagate through to the right end whereas only the other polarization mode (say, TM) is allowed to propagate through to the left end. With this arrangement, a wave can propagate only in one direction (say, entering the left end as a TM wave, converted into a TE wave in the gyrator and then propagating through the right end as a TE wave) but not in the opposite direction.

The principle of using multiple reflections in a waveguide structure for enhanced polarization conversion as herein disclosed can also be applied to magneto-optic memory devices such as are used in computer devices. In such devices, particularly in the so-called magnetic bubble, digital information is stored magnetically in the form of magnetic domains. The magnetically stored information can be read in various ways. It is now proposed that an optical beam upon interacting with the magnetic domain as will be explained has its polarization direction rotated by a certain angle. The magnitude of the optical readout signal is found to be proportional to the angle of rotation and can be made sufficiently cumulative as to be useful. In ordinary magneto-optic readout devices the interaction between the laser beam and the magnetic beam is rather limited and as a result the amount of rotation is small and is difficult to bring to useful application. The waveguide structure and optical readout proposed in the present invention enhances the interaction by making the polarization rotation effect cumulative through multiple reflections of the laser beam inside the waveguide layer. Thus, referring to FIG. 19 there is shown a schematic cross-sectional view of one of possible schemes for utilizing the present invention for an optical readout for a magnetic memory. Thus there is shown a means forming an optical waveguide layer 70 having a predetermined index of refraction $n_f$. Means is provided for forming upper and lower boundary layers 72,74 disposed in intimate contact above and below or on each side of the waveguide layer 70. These boundary layers respectively have indices of refraction $n_d$, $n_m$. Each of the indices of refraction are related by $n_f > a_d$, $n_m$ and this condition defines the waveguide layer in such a way that propagation of energy therein can take place.

Coupling means is provided for introducing a beam of light through the upper layer into the waveguide layer and for receiving said beam after it is propagated at a predetermined distance in the waveguide layer. Such means typically takes the form of a coupling prism 76 of the type that is known in integrated optics art. As shown, two laser beams 78 and 80, for example, enter the coupling prism and are refracted downwardly and coupled through the upper boundary layer into the waveguide layer and subsequently after multiple internal reflections it re-emerges as output beams, 82,84, the purpose of which will be explained hereinafter. In the examples shown, the waveguide layer is contained or is made of magnetic material having two alternate states having inducible magnetic flux orientation.

Means are provided for inducing the magnetic material to shift from one state to another and so positioned on the opposite side from the coupler. Such means can vary depending upon the nature of the magnetic material as shown in FIG. 19. One can obtain selective domain magnetization reversal in the x direction utilizing an overlay structure conductive grid 86 which guides the movement of the magnetized domains, commonly called magnetic bubbles. Typical material useful for carrying out construction of the layer 70 of the structure of FIG. 19 is

$$Eu_xEr_{3-x}Ga_yFe_{5-y}O_{12}$$

which has a magnetic anisotropy resulting in magnetization and reversal states oriented in the x direction. The material is sandwiched between boundary layers, 73, 74 made of $Eu_xEr_{3-x}Ga_5O_{12}$ or $Gd_3Ga_5O_{12}$, for example. In the case of FIG. 20 the magnetization lies in the plane of waveguide, i.e. the z direction and can be excited by utilizing a moveable magnetic head 86 having a gap 88 positioned directly below the domain of interest. Such results in domain magnetization reversal in the z direction. In this case, the magnetic material has low magnetic anisotropic resulting in the z-directional control. Example of such a waveguide material in FIG. 20 includes the ferrites, $(MFe_2O_4)$ or garnets $(M_3Fe_5O_{12})$ where M is a rare earth, and is deposited on a substrate material with matching lattice constant.

In connection with the example of FIG. 19 the resultant so-called magnetic bubbles can be moved under the influence of the overlay grid the current through which controls the location of the bubble. Consideration will now be given to the intereaction of the light beam as it is coupled through the prism and interacts for a given length within the waveguide layer.

For evanescent modes, the decay constant p is of the order of the optical wave number k. Therefore, a film of 10 microns thick would behave as if it were a semi-infinite medium. If we choose the indices of refraction $n_m$, $n_f$, $n_d$ and $n_p$ for the various media in such a way that $n_p$, $n_f > n_d$, $n_m$, then a light beam can be coupled into and out of the optical waveguide. As compared to the conventional read-out device using Kerr effect, a significant improvement in the mode conversion efficiency is expected through multiple total reflections in the optical waveguide.

If the digital information is written by a magnetic head, then the domain magnetization will be either in the $+z$ or $-z$ direction and we have the longitudinal case. If the digital information is stored in the form of magnetic bubbles, then the domain magnetization will be either in the $+x$ or $-x$ direction and we have the polar case. In either the longitudinal or the polar case, the signs of $r_{EM}$ and $r_{ME}$ change as the magnetization direction reverses. As a result, the relative phase of TE and TM modes changes, and the polarization of the outgoing wave is rotated by an angle either $+\theta_F$ or $-\theta_F$ with respect to the incoming wave.

There are three basis factors which we must consider in comparing the performance of optical read-out devices. The first factor is the interaction length. Although it is possible in theory to achieve a complete mode conversion, the amount of conversion is limited in practice by the size of a magnetic domain. Taking z=50 microns to be the domain size, W=0.5 micron for the film thickness, and $\theta=55°$, we have m=36 reflections. Note that the curves in FIG. 10 for different $\delta\phi$ almost coincide at small values to m. As long as $m\delta\phi <$, converted fields from successive reflections are almost in phase and hence additive. Therefore for small m, we may use the results calculated under the phase-matched condition. From FIG. 9, we fing $B_m=0.5$ if $K_{12}$. Thus, in $GdIG^{36}$ where $K_{12}=2\times 10^{-3}$, we would expect a value of 0.1 for $B_m$ or a rotation of 5.8° of the polarization.

Previously, multi-layer structures [37, 38] have been proposed to enhance the read-out signal. In the previous proposals, the magnetic film is a part of the propagation medium. Significant improvement in the read-out signal has been reported. [39] However, the experiment was performed on magnetic films with uniform magnetization instead of domain magnetization. It is conceivable, therefore, that the reported improvement could be significantly reduced if the magnetic film were operated under small-size domains. The ratio of the domain size to the total thickness of the layered structure is the key factor because it determines the maximum number of multiple reflections.

The other two considerations regarding a read-out device are the loss in the magnetic medium and the adjustment for maximum read-out signal. In the structure we propose, the magnetic film serves as the waveguide wall where the wave is in the evanescent mode. Therefore, a magnetic substance with moderate loss may still be usable as a substrate material in cases where the ratio of the Verdet constant to the loss constant is reasonably large. It is expected that we have a wider range in the choice of magnetic materials for the waveguide case than for the layered-structure case. Second, the wave at the waveguide boundary is totally reflected once $\theta > \theta_{crit}$. For optimum performance of the layered structure, matching of impedance between the different dielectric layers is important. On the other hand, for small m, the phase-matching condition in the waveguide case becomes less critical. It seems that the waveguide structure offers some definite advantages over the multi-layer structure.

Reference is made to the previous polarization converter analysis and particularly to that portion of the analysis indicating conversion of TE or TM to the respective TM or TE polarizations (pages 19-25). It is noted that the off diagonal elements appear in the magneto-optic case where there exists a non-vanishing magnetization. In accordance with page 13, line 5, $k_{ij}=iA_{ij}$ eMe. When the sign of the induced magnetization changes the associated permittivity tensor component also changes. This results in switching the partially converted wave direction. When added to the unconverted portion, the result is a combined vector which shifts in orientation a certain amount upon each reflection and in accordance with the present invention, these shifts are cumulative. By using a polarizer arranged to discriminate completely at the output against one of the orientations the cumulative shift in output orientation can be detected by zeroing the output of the polarizer for that orientation corresponding to one state of magnetization of the material and then looking for a finite output whenever the material is induced into the second state. Thus, the output will be two valued, either zero or finite depending upon the direction of magnetization within the domain of the magnetic material. This shift is cumulative and the resultant orientations of the various vectors are indicated by the angle $\theta_f$ in the FIG. 19.

VIII. Summary

The use of gyrotropic and anisotropic material for mode conversion and signal control in thin-film optical waveguide application has been disclosed. A complete conversion from the TE to TM mode, or vice versa, is possible if the phase-matching condition is satisfied for a simultaneous propagation of degenerate TE and TM modes. Various schemes to achieve complete mode conversion are proposed. The essential property of the scattering matrix is $r'_{EM} r'_{ME} = -|r_{12}|^2$ and this condition for complete conversion is satisfied in all optical media with a Hermitian permittivity tensor. The orientation of the gyrotropic and anisotropic material is so chosen that the mode conversion device is operated in either the longitudinal or the polar configuration.

The mode converter presented herein is a continuous one from which we can have any desired ratio of the TE or TM amplitude. The other important properties of the mode converter can be summarized as follows. If the direction of wave propagation reverses, the mode conversion factor changes its sign for the longitudinal gyrotropic and anisotropic cases and remains the same for the polar gyrotropic and anisotropic cases. On the other hand, the mode conversion factor always changes its sing if the bias field or the crystal orientation reverses its direction. These features are very useful because with them one can properly divide and mix the two modes to obtain the desired device function.

The condition which is crucial to the realization of the various device functions is the phase-matching condition $\phi^E = \phi^M$. These proposed several schemes have been proposed to fulfill this condition. In these calculations, substrate and film materials familiar to workers in the field have been disclosed to show that the thin-film optical waveguide mode converters proposed here are practicable. Two important practical considerations are the tolerances in the adjustment of the incident angle and in the control of the film thickness. Optimum design can be achieved by choosing a proper refractive index for the film and a proper amount of birefringence for the substrate or the top layer.

The requirements imposed on the control of the incident angle and the film thickness can be met in practice if we use a substrate material having large off-diagonal elements, say $10^{-3}$ or larger. Ferroelectric crystals operated near the Curie temperature but in the paraelectric phase seem to be most suitable for use as the electrooptic substrate material. There are magnetic materials which have a relatively large Faraday rotation but, at the same time, an appreciable extinction coefficient (as a result of either high conductivity or moderate absorption). It is expected that a reasonable loss constant may be tolerable in the substrate material because of the evanescent nature of the wave. Furthermore, one can use an intermediate layer between the substrate and the film to moderate a high loss, a large birefringence, or a high conversion in the substrate. It is useful, therefore, to extend the analysis to such structures.

APPENDIX 1

Evaluation of Field Components at the Film-Substrate Boundary

For an arbitrary direction of propagation, an electromagnetic wave in a gyrotropic or anisotropic medium possesses all three field components $E_x$, $E_y$, and $E_z$. We express the field components in terms of $E_y$:

$$E_x = AE_y, \quad E_z = B'E_y = B \cos\theta E_y \tag{A1a,b}$$

$$E_y = C\eta' E_y, \quad H_s = -D'\eta' E_y = -D\eta' \cos\theta E_y \tag{A1c,d}$$

where $\theta' = \sqrt{\epsilon_f/\mu_0}$, $\epsilon_f$ is the permittivity of the thin film, and $\theta$ is the incident angle (FIG. 3). The coefficients A, B, C, and D are evaluated in Appendix 2. Since there are two eigen modes [$p_1$ and $p_2$ in Eq. (5)] in the substrate, we use subscripts 1 and 2 to indicate the field quantities associated with each mode.

In the isotropic film, we have: (1) for the TE mode, $\vec{E}$ in the y direction and $\vec{H}$ in the x-z plane and (2) for the TM mode, $\vec{H}$ in the y direction and $\vec{E}$ in the x-z plane. Applying the boundary conditions to the field components (FIG. 3), in the order of $E_y$, $E_z$, $H_y$, and $H_z$, we obtain $$E_E + E'_E = E_1 + E_2 \tag{A2a}$$

$$E_M \cos\theta - E'_M \cos\theta = E_1 B_1 \cos\theta + E_2 B_2 \cos\theta \tag{A2b}$$

$$E_M \eta' + E'_M \eta' = E_1 C_1 \eta' + E_2 C_2 \eta' \tag{A2c}$$

$$-E_E \eta' \cos\theta + E'_E \eta' \cos\theta = -E_1 D_1 \eta' - E_2 D_2 \eta' \tag{A2d}$$

The fields $E'_E$, $E'_M$, $E_1$, and $E_2$ can be expressed in terms of $E_E$ and $E_M$ by inverting the matrix. Let $$\begin{bmatrix} E'_E \\ E'_M \\ E_1 \\ E_2 \end{bmatrix} = \begin{bmatrix} r_{EE} & r_{em} \\ r_{ME} & r_{MM} \\ P_1 & Q_1 \\ P_2 & Q_2 \end{bmatrix} \begin{bmatrix} E_E \\ E_M \end{bmatrix} \tag{A3}$$

The various matrix elements are $$r_{EE} = R^{-1}[(B_1+C_1)(1-D_2) - (B_2+C_2)(1-D_1)] \tag{A4a}$$

$$r_{EM} = R^{-1} 2(D_2 - D_1) \tag{A4b}$$

$$r_{ME} = R^{-1} 2(B_1 C_2 - B_2 C_1) \tag{A4c}$$

$$r_{MM} = R^{-1}[(C_1-B_1)(1+D_2) - (C_2-B_2(1+D_1)] \tag{A4d}$$

$$P_1 = -R^{-1} 2(B_2+C_2), \quad Q_1 = R^{-1} 2(1+D_2), \tag{A4e,f}$$

$$P_2 = R^{-1} 2(B_1+C_1), \quad Q_2 = -R^{-1} 2(1+D_1) \tag{A4g,h}$$

$$R = (B_1+C_1)(1+D_2) - (B_2+C_2)(1+D_1) \tag{A4i}$$

APPENDIX 2

Relation between the Field Components in the Substrate (a) The Longitudinal Configuration The relations between the electric fields can be obtained from the wave equation. From Eq. (2), we have $$\begin{bmatrix} \beta^2 - K_{11} & -K_{12} & -i\beta p \\ -K_{12}^* & \beta^2 - p^2 - K_{22} & 0 \\ -ip\beta & 0 & -p^2 - K_{33} \end{bmatrix} \begin{bmatrix} E_x \\ E_y \\ E_z \end{bmatrix} = 0 \tag{A5}$$

Thus, we find $$A = \frac{\beta^2 - p^2 - K_{22}}{K_{12}^*}, \quad B' = \frac{-ip\beta}{p^2 + K_{33}} \frac{\beta^2 - p^2 - K_{22}}{K_{12}^*} \tag{A6a,b}$$

The step taken in Eq. (A6b) is based on an identity derived from Eq. (5a). This step greatly simplifies the calculations later on. The magnetic fields can be obtained from $\nabla \times \vec{E}$. Using the relations $\beta = n_f \sin\theta$ and the identity $$\frac{\beta^2 - p^2 - K_{22}}{p^2 + k_{23}} = \frac{|k_{12}|^2}{\beta^2 K_{33} - K_{11}K_{33} - K_{11}p^2} \quad (A7)$$

we find the various coefficients in Eq. (A1) to be $$B = \frac{-ip\beta}{\beta^2 K_{33} - K_{11}K_{33} - K_{11}p^2} \frac{K_{12}}{\cos\theta} \quad (A8a)$$

$$C = \frac{K_{33}K_{12}\sin\theta}{\beta^2 K_{33} - K_{11}K_{33} - K_{11}p^2}, \quad D = \frac{-ip}{\beta}\tan\theta \quad (A8b,c)$$

The matrix elements given in Eq. (7) can be found by substituting Eq. (A8) in Eq. (A4) and by letting $F = R/N$ where $N = (K_{12}\sin\theta)/(n_f\cos^2\theta)$. Furthermore, the following identity $$L_1 L_2 = -K_{33}\beta^2 |K_{12}|^2 \quad (A9)$$

is used in obtaining Eq. (7d) from Eq. (A4c). This step is taken so that the relation between $r_{ME}$ and $r_{EM}$ can be clearly seen. For completeness, the matrix elements for the evanescent waves are given below:

$$P_{1,2} = \frac{\mp 2}{F} \frac{G_{2,1}}{L_{2,1}} n_f \cos\theta; \quad Q_{1,2} = \frac{\pm 2}{F} \frac{J_{2,1}}{K_{12}} \frac{\cos\theta}{\sin\theta} \quad (A10a,b)$$

(b) The Polar Configuration

The field components in the polar configuration are related through the following equation:

$$\begin{bmatrix} \beta^2 - K_{11} & 0 & -ip\beta \\ 0 & \beta^2 - p^2 - K_{22} & K_{23} \\ -ip\beta & K_{23}^* & -p^2 - K_{33} \end{bmatrix} \begin{bmatrix} E_x \\ E_y \\ E_z \end{bmatrix} = 0 \quad (A11)$$

Using Eq. (A11) and the identity $$\frac{\beta^2 - p^2 - K_{22}}{-K_{23}} = \frac{K_{23}^*(\beta^2 - K_{11})}{\beta^2 K_{33} - K_{11}K_{33} - K_{11}p^2} \quad (A12)$$

we obtain the following coefficients $$A = \frac{ip\beta K_{23}^*}{L}, \quad B = \frac{K_{23}^*(\beta^2 - K_{11})}{L\cos\theta} \quad (A13a,b)$$

$$C = \frac{ip K_{11} K_{23}^* \sin\theta}{L\beta}, \quad D = \frac{-ip}{\beta}\tan\theta \quad (A13c,d)$$

The various matrix elements for the polar configuration can be obtained by following a procedure similar to the one used for the longitudinal configuration if proper modifications are made. First, the common factor is $N = iK^*_{23}/(n_f^2 \cos^2\theta)$ in $F = R/N$. Second, the following identity $$L_1 L_2 = K_{11}(\beta^2 - K_{11})|K_{23}|^2 \quad (A14)$$

is used in obtaining Eq. (7f) from Eq. (A4c). Finally, the quantity $K_{23}$ should replace $K_{12}$ in Eq. (A10).

APPENDIX 3

Computation of the Multiple-scattering Matrix by Sylvester's Theorem

Sylvester's theorem states that for a matrix u with distinct eigen values $\lambda_1, \ldots, \lambda_n$, the matrix polynomial can be written as $$P(u) = \sum_{i=1}^{n} P(\lambda_1) Z(\lambda_1) \quad (A15)$$

where $$Z(\lambda_1) = \prod_{\substack{j=1 \\ j \neq 1}}^{n} (I\lambda_j - u) / \prod_{\substack{j=1 \\ j \neq 1}}^{n} (\lambda_j - \lambda_i) \quad (A16)$$

and I is the identity matrix. From Eq. (22), the two eigen values are $$\lambda_{1,2} = r_{11} \pm i r_{12} = \exp(\pm i\phi_1) \quad (A17)$$

where $\phi_1 = \tan^{-1}(r_{12}/r_{11})$ and $r_{11}^2 + r_{12}^2 = 1$ on account of energy conservation. Letting $P(u) = u^m$, we find $$u^m = \frac{1}{2ir_{12}}[(\lambda_2\lambda_1^m - \lambda_1\lambda_2^m)I - (\lambda_1^m - \lambda_2^m)u] \quad (A18)$$

Thus, Eq. (23a) becomes $$[r']^m = \begin{bmatrix} \cos(n\phi_1) & \sin(n\phi_1)\exp(i\alpha) \\ -\sin(n\phi_1)\exp(-i\alpha) & \cos(n\phi_1) \end{bmatrix} \quad (A19)$$

A similar equation is also obtained for Eq. (23b).

Now we turn to the case where the synchronous condition of Eq. (17) is not satisfied. We let $\phi^M = q'2\pi + \delta\phi/2$ and $\phi^E = q2\pi - \delta\phi/2$. Thus, $r'_{EE} = r_{11}\exp(-i\delta\phi/2)$ and $r'_{MM} = r_{11}\exp(i\delta\phi/2)$. We notice, however, that $\alpha + \alpha' = (q+q')2\pi$ is still valid. Therefore, the elements $r'_{EM}$ and $r'_{ME}$ remain unchanged. The two eigen values of the scattering matrix are $$\lambda_{1,2} = r \pm i r' = \exp(\pm i\phi_2) \quad (A21)$$

where $r = r_{11}\cos(\delta\phi/2)$ and $r' = (1-r^2)^{\frac{1}{2}}$. Again, the condition $r_{11}^2 + r_{12}^2 = 1$ is used in the calculation. The matrix elements of $[r'_{ij}]^m$ are thus found to be $$A_{jj} = \cos(m\phi_2) \pm i \sin(m\phi_2) r_{11} \sin(\delta\phi/2)/\sin(\phi_2) \quad (A22a)$$

$$B_{ij} = \pm r_{12} \sin(m\phi_2)/\sin(\phi_2) \quad (A22b)$$

which replaces Eq. (23). The positive sign is for $A_{EE}$ and $B_{EM}$ while the minus sign is for $A_{MM}$ and $B_{ME}$. Since energy is conserved in the system, the following identities exist: $|A_{EE}|^2 + |B_{ME}|^2 = 1$ and $|A_{MM}|^2 + |B_{EM}|^2 = 1$. These relations can be obtained from Eq. (A22) by noting that $\sin^2\phi_2 = 1 - r_{11}^2 \cos^2(\delta\phi/2)$.

REFERENCES

1. P. K. Tien, R. Ulrich, and R. J. Martin, Appl. Phys. Letters, Vol. 14, p. 291 (1969).
2. M. L. Dakes, L. Kuhn, P. F. Heindrich, and B. A. Scott, Appl. Phys. Letters, Vol. 16, p. 523 (1970).
3. D. Hall, A. Yariv and E. Garmire, Appl. Phys. Letters, Vol. 17, p. 127 (1970).
4. J. H. Harris and R. Shubert, IEEE Trans. Microwave Theory Tech., Vol. MIT-17, p. 269 (1971).

5. H. Kogelnik and C. V. Shank, Appl. Phys. Letters, Vol. 18, p. 152 (1971).
6. S. E. Miller, Bell Sys. Tech. J., Vol. 48, p. 2059 (1969).
7. N. Bloembergen, P. S. Pershan, and L. R. Wilson, Phys. Rev., Vol. 120, p. 2014 (1960).
8. I. P. Kaminov, Phys. Rev. Letters, Vol. 6, p. 528 (1961).
9. P. K. Tien and R. Ulrich, J. Opt. Soc. Am., Vol. 60, p. 1325 (1970).
10. D. O. Smith, Opt. Acta., Vol. 12, p. 13 and p. 195 (1965).
11. M. J. Freiser, IEEE Trans. on Magnetics, Vol. MAG-4, p. 152 (1968).
12. G. N. Ramachandran and S. Ramaseshan, "Crystal Optics," Encyclopedia of Physics (Handbuch der Physik), Vol. XXV/1, Springer, Berlin (1961).
13. L. D. Landau and E. M. Lifschits, *Electrodynamics of Continuous Media*, Addison-Wesley Publishing Co., Reading, Mass. (1960).
14. P. S. Pershan, J. Appl. Phys., Vol. 38, p. 1482 (1967).
15. R. C. Le Craw, D. L. Wood, J. F. Dillon, Jr., and J. P. Remeika, Appl. Phys. Letters, Vol. 7, p. 27 (1965).
16. G. D. Boyd, R. C. Miller, K. Nassau, W. L. Bond, and A. Savage, Appl. Phys. Letters, Vol. 5, p. 234 (1964).
17. J. C. Suits, B. E. Argyle, M. J. Freiser, J. Appl. Phys., Vol. 37, p. 1391 (1966).
18. K. Y. Ahn and T. R. McGuire, J. Appl. Phys., Vol. 39, p. 5061 (1968).
19. P. V. Lenzo, E. G. Spencer, and A. A. Ballman, Appl. Phys. Letters, Vol. 11, p. 23 (1967).
20. J. E. Geusic S. K. Kurtz, L. G. Van Uitert, and S. H. Wemple, Appl. Phys. Letters, Vol. 4, p. 141 (1964).
21. M. Born and E. Wolf, *Principle of Optics*, p. 46, Pergamon Press, London (1959).
22. R. A. Frazer, W. J. Duncan, A. R. Collar, *Elementary Matrices*, p. 78, Cambridge University Press, Cambridge (1952).
23. Corning Glass Works Literature.
24. American Institute of Physics Handbook, McGraw-Hill Book Co., (1957) p. 6-24.
25. A. Smakula, *Einkristalle*, Springer, Berlin (1962).
26. C. D. Mee, Contemp. Phys., Vol. 8, p. 385 (1967).
27. T. M. Bleniewski and S. J. Czyzak, J. Opt. Soc. Am., Vol. 53, p. 496 (1963).
28. D. H. Hensler, J. D. Cuthbert, R. J. Martin, and P. K. Tien, Appl. Opt., Vol. 10, p. 1037 (1971).
29. R. Wolfe, A. J. Kurtzig, and R. C. LeCraw, J. Appl. Phys., Vol. 41, p. 1218 (1970).
30. L. W. Tilton, E. K. Plyler, R. E. Stephens, J. Opt. Soc. Am., Vol. 40, p. 540 (1950).
31. D. A. Pinnow, L. G. Van Uitert, A. N. Warner, and W. A. Bonner, Appl. Phys. Letters, Vol. 15, p. 83 (1969).
32. S. Wang, J. D. Crow, and M. Shah, to be published in Appl. Phys. Letters (September 15 issue).
33. C. L. Hogan, Rev. Mod. Phys., Vol. 25, p. 253 (1953).
34. L. J. Aplet and J. W. Carson, Appl. Optics, Vol. 3, p. 544 (1964).
35. J. E. Geusic and H. E. D. Scovil, Bell Sys. Tech. J., Vol. 41, p. 1371 (1962).
36. J. T. Chang, J. F. Dillon, Jr., and U. F. Gianola, J. Appl. Phys., Vol. 30, p. 1110 (1965).
37. J. Franz and A. Schauer, Optik, Vol. 18, p. 186 (1961).
38. D. O. Smith, J. Appl. Phys., Vol. 35, p. 772 (1964).
39. A. S. Hoffman, W. R. Hagemeier, and S. H. Cushner, J. Appl. Phys., Vol. 41, p. 1407 (1970).

I claim:

1. Polarization converter for use in optical waveguide systems, a first layer serving as a substrate and support for said converter and having a predetermined permittivity tensor $\bar{\epsilon}_s$, means forming a thin film optical waveguide disposed in intimate contact on said first layer and having a permittivity tensor $\bar{\epsilon}_f$, means forming a top layer disposed on the other side of the said thin film optical waveguide and having a predetermined permittivity tensor $\bar{\epsilon}_t$, said permittivity tensor $\bar{\epsilon}_f$ having certain diagonal elements which control the propagation of a particular wave, said diagonal elements being selected to be greater than the corresponding diagonal elements of permittivity tensors $\bar{\epsilon}_t$ and $\bar{\epsilon}_s$, one of said waveguide or adjacent layers being made of a material having propagation characteristics which are polarization dependent for causing the coupling between TE and TM polarizations, said material having a defined interaction length and said film having a thickness constructed and arranged to satisfy the phase-matched conditions over said length and cummulative conversion of TE to TM or TM to TE waves results as such waves are propagated through at least a portion of said length.

2. Polarization converter as in claim 1 in which said thin film waveguide layer thickness is of the order or ten to fifty free space wavelengths.

3. A polarization converter as in claim 1 in which said substrate is made of a material having a propagation characteristic which is polarization dependent.

4. Polarization converter as in claim 3 in which said substrate is anisotropic.

5. Polarization converter as in claim 1 in which said substrate is gyrotropic.

6. Polarization converter as in claim 1 in which said material having propagation characteristics which are polarization dependent is contained within said waveguide layer.

7. Polarization converter as in claim 1 in which said material is anisotropic.

8. Polarization converter as in claim 1 in which said material is gyrotropic.

9. Polarization converter as in claim 1 in which said material having propagation characteristics which are polarization dependent is gyrotropic by induction and further including means for applying a magnetic field to said material.

10. Polarization converter as in claim 1 in which said material is optically active.

11. Polarization converter as in claim 1 in which said material is anisotropic by induction and further including means for applying an electric field to said material.

12. Polarization converter as in claim 1 in which said material is inherently anisotropic.

13. Polarization converter as in claim 1 in which said first, second and third layers have an actual length equal to an integral number of defined interaction lengths.

14. A mode converter as in claim 1 in which said $\phi_E = \phi_M$ condition is unsatisfied by a small amount $\delta\phi$ and further including means for launching microwaves through said converter, the frequency of said microwaves being selected to compensate for said phase-mismatch $\delta\phi$.

15. A mode converter as in claim 1 in which said $\phi_E = \phi_M$ condition is unsatisfied by a small amount $\delta\phi$ and further including means for launching an acoustic wave through a predetermined length of said converter, the frequency of said acoustic waves being selected to compensate for said phase-mismatch $\delta\phi$.

16. Polarization converter for use in optical waveguide systems, a first layer serving as a substrate and support for said converter having a predetermined permittivity tensor $\vec{\epsilon_s}$, means forming a thin film optical waveguide disposed in intimate contact on said first layer and having a permittivity tensor $\vec{\epsilon_f}$ means forming a top layer disposed on the other side of said thin film optical waveguide and having a predetermined permittivity tensor $\vec{\epsilon_t}$ said permittivity tensor $\vec{\epsilon_f}$ having certain diagonal elements which control the propagation of a particular wave, said diagonal elements being selected to be greater than the corresponding diagonal elements of permittivity tensors $\vec{\epsilon_t}$ and $\vec{\epsilon_f}$ one of said waveguide or adjacent layers being made of a material having propagation characteristics which are polarization dependent for causing the coupling between TE and TM polarizations and thereby also establish two eigen modes of propagation through said waveguide, each of said eigen modes being a combination of TE and TM polarization, said eigen modes having different phase velocities, said film having a thickness constructed and arranged to satisfy the phase-matched condition such that $\phi E = \phi M$ and the two eigenmodes contain nearly equal TE and Tm components, said material having an interaction length such that the relative phase of the eigen modes changes over said length to cause mutual cancellation of either the TE or TM components from both of said modes, whereby conversion of TE to TM or TM to TE waves results as they are propagated through said length.

17. In optical switching device for use in optical waveguide ciruits, an electro-optic or magneto-optic mode converter for at least partially changing incoming TE or TM waves to waves of the opposite polarization, means for selectively supplying a bias field to said mode converter said bias field having at least two states, one of which operates to cause operation of said converter.

18. An optical switch as in claim 17 in which said converter is operated at the full conversion point so that an incoming wave of one polarization is either passed unchanged when said signal is absent or changed into a wave of the other polarization when said signal is present.

19. An optical switching device as in claim 17 further including a two-branch circuit forming an output thereof, said branches being constructed and arranged to exclusively propagate TE or TM waves respectively.

20. An optical switching device as in claim 17 in which said converter is operated at the half-conversion point whereby an input of equal strength TE and TM waves of proper phase relationship results in an output of either pure TE or pure TM waves.

21. An optical switch as in claim 17 further including means coupled to the input of said converter for adjusting the relative phase of the input TE and TM waves before passing to said converter.

* * * * *